US008786472B1

(12) United States Patent
Prince

(10) Patent No.: US 8,786,472 B1
(45) Date of Patent: Jul. 22, 2014

(54) LOW COMPLEXITY NON-INTEGER ADAPTIVE SAMPLE RATE CONVERSION

(71) Applicant: Raytheon Company, Waltham, MA (US)

(72) Inventor: Gregory B. Prince, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/770,862

(22) Filed: Feb. 19, 2013

(51) Int. Cl.
*H03M 7/00* (2006.01)
*H03H 17/06* (2006.01)

(52) U.S. Cl.
CPC ....... *H03H 17/0621* (2013.01); *H03H 17/0628* (2013.01)
USPC ............................................. 341/61; 341/123

(58) Field of Classification Search
CPC .................................................. H03H 17/0621
USPC ..................................... 341/61, 123
See application file for complete search history.

(56) References Cited

U.S. PATENT DOCUMENTS

| 7,227,477 | B2* | 6/2007 | Ye | 341/61 |
| 7,411,525 | B2* | 8/2008 | Hirano | 341/61 |
| 7,417,569 | B2* | 8/2008 | Kong | 341/61 |
| 8,076,977 | B2* | 12/2011 | Menkhoff | 331/1 A |
| 8,405,532 | B1* | 3/2013 | Clark et al. | 341/61 |
| 8,538,713 | B2* | 9/2013 | Bilgin et al. | 702/66 |
| 8,624,760 | B2* | 1/2014 | Ngo et al. | 341/61 |

* cited by examiner

*Primary Examiner* — Brian Young
(74) *Attorney, Agent, or Firm* — Schwegman, Lundberg & Woessner, P.A.

(57) ABSTRACT

Generally described herein are methods and systems for sample rate conversion of non-integer and integer factors. In one or more embodiments an apparatus can include a sample rate converter that can include an input configured to receive an input signal with a first frequency and an output configured to provide an output signal with a second frequency different from the first frequency. The sample rate converter can include a filter coefficient lookup table and a numerically controlled oscillator configured to provide filter coefficients from the filter coefficient lookup table at a rate that is a function of the first frequency and the second frequency. The sample rate converter can include a multiplier configured to produce an output that is the product of a filter coefficient of the filter coefficients from the numerically controlled oscillator and a sample of an input signal and an accumulator configured to sum an output of the multiplier and provide a result of the summation when the accumulator receives an indicator to dump the result.

15 Claims, 21 Drawing Sheets

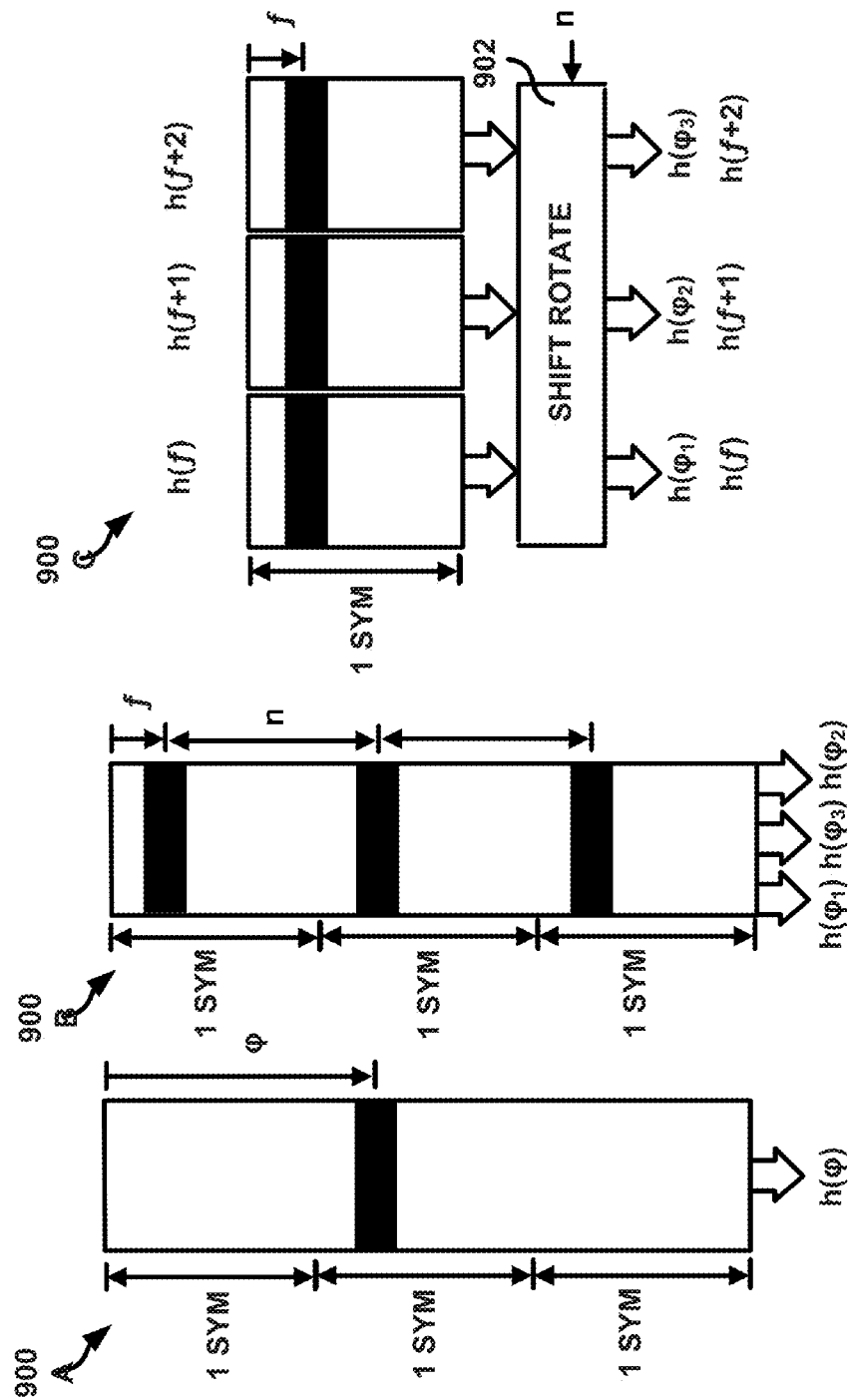

US 8,786,472 B1

LOW COMPLEXITY NON-INTEGER ADAPTIVE SAMPLE RATE CONVERSION

GOVERNMENT RIGHTS

This invention was made with United States Government support under Contract Number FA8726-07-C-0005. The United States Government has certain rights in this invention.

TECHNICAL FIELD

This disclosure relates generally to systems and methods that include a modem, and more specifically to systems and methods that include a sample rate converter.

BACKGROUND ART

In device design, timing compensation can be important for digital decision making in a demodulator. To accommodate different timings, either the sampling or digital processing clock can be adjusted or some mechanism can be constructed to interpolate timing.

BRIEF DESCRIPTION OF THE DRAWINGS

FIG. 9A shows a block diagram of an example of a structure for a filter coefficient lookup table.

FIG. 9B shows a block diagram of an example of another structure for a filter coefficient lookup table.

FIG. 9C shows a block diagram of an example of yet another structure for a filter coefficient lookup table.

DESCRIPTION OF THE EMBODIMENTS

Figure 1:
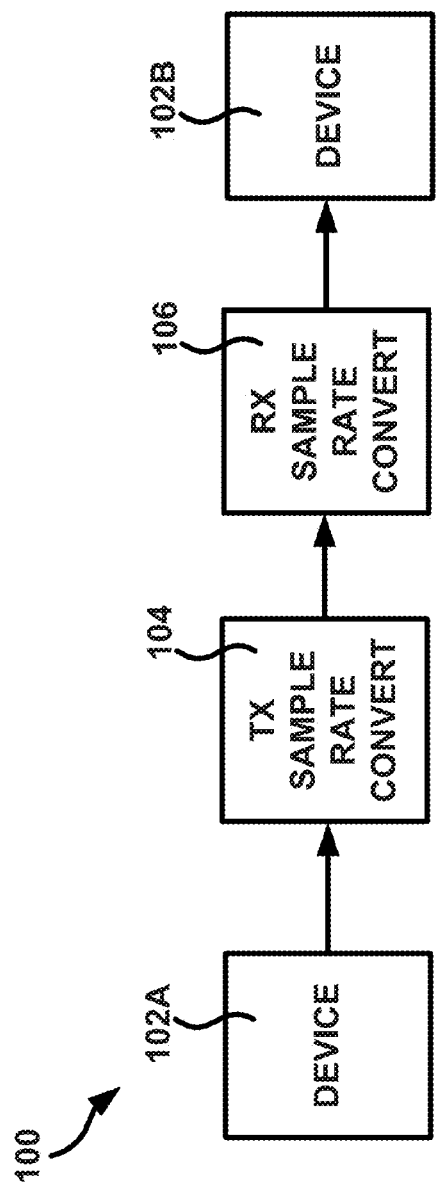
FIG. 1 shows a logical block diagram of an example of a sample rate conversion system.

In the following detailed description, reference is made to the accompanying drawings that form a part hereof, and in which is shown by way of illustration specific embodiments in which the inventive subject matter can be practiced. These embodiments are described in sufficient detail to enable those skilled in the art to practice them, and it is to be understood that other embodiments can be utilized and that structural, logical, and electrical changes can be made without departing from the scope of the inventive subject matter. Such embodiments of the inventive subject matter can be referred to, individually and/or collectively, herein by the term "invention" merely for convenience and without intending to limit the scope of this application to any single invention or inventive concept if more than one is in fact disclosed. The following description is, therefore, not to be taken in a limited sense, and the scope of the inventive subject matter is defined by the appended claims.

This disclosure relates generally to sample rate conversion of non-integer factors (e.g., input frequency/output frequency or the reciprocal thereof). Systems, apparatuses, and methods discussed herein can also accommodate integer factors as well. Generally, by matching certain clock speeds in a transmit Sample Rate Converter (SRC) and a receive SRC, and using a Numerically Controlled Oscillator (NCO) to produce filter coefficients at a rate that is a function of the input frequency and output frequency of the SRC, a wide variety of non-integer factors can be accommodated.

When dealing with non-integer factors (e.g., waveform frequency to clock frequency ratios) in a sample rate conversion setting, rational approximations, such as polyphase implementations with set filter banks in a Farrow structure and polynomial interpretation can be used. Another solution can include having a lookup table to define the timing. Yet another solution can be to restrain the frequency of the waveform and the clock to be an integer ratio. These implementations can be complex (e.g., a lookup table can be very large and grows exponentially as more non-integer ratios are accounted for), non-adaptive, and limited to integer factor sample rate conversions.

In SRCs, timing compensation can be important for digital decision making in a demodulator. An SRC can be implemented on an uplink and a downlink to isolate a waveform from digital hardware. Such isolation can be used in, for example, a High Data Rate (HDR) Radio Frequency (RF) ground modem.

In one or more embodiments, a transmitter and a receiver can perform digital to analog or analog to digital at the same, fixed rate. The transmitter and receiver can accommodate timing skew or a continuous range of data rates. In one or more embodiments, a hardware implementation can include 32-bit NCO, with 11-bit filter coefficients and 129 taps. In one or more embodiments, a slight modification of an algorithm can be implemented by using one more tap than required for subsampling, thus leaving 128 taps. One or more embodiments can be used in a modem to create a multi-rate modem, or other transceiver. In one or more embodiments, a resampled spectral lobe can be sufficiently low so as to keep the spectral lobe within a specified spectral mask.

The SRC can include parallel filter taps. The SRC can enable a broad range of fractional baud rates to operate with fixed clock hardware. An oscillator (e.g., NCO) can control the filter taps that are selected to be applied to the signal of interest. This can be done by converting fixed clock timing into waveform sample timing, or vice versa, as a function of the ratio of the clock timing and waveform sampling timing. The filter signal can accumulate until the oscillator reaches its next "tick", then the signal can be sent to the output.

Referring now to FIG. 1, a system 100 can include a device 102A that can be communicatively coupled to a transmit SRC 104. The transmit SRC 104 can be communicatively coupled to a receive SRC 106. The combination of the transmit SRC 104 and the receive SRC 106 can convert a signal from device 102A to a frequency compatible with device 102B. In one or more embodiments, the devices 102A and 102B are part of a device that includes both the receive SRC 106 and the transmit SRC 104.

Figure 2:
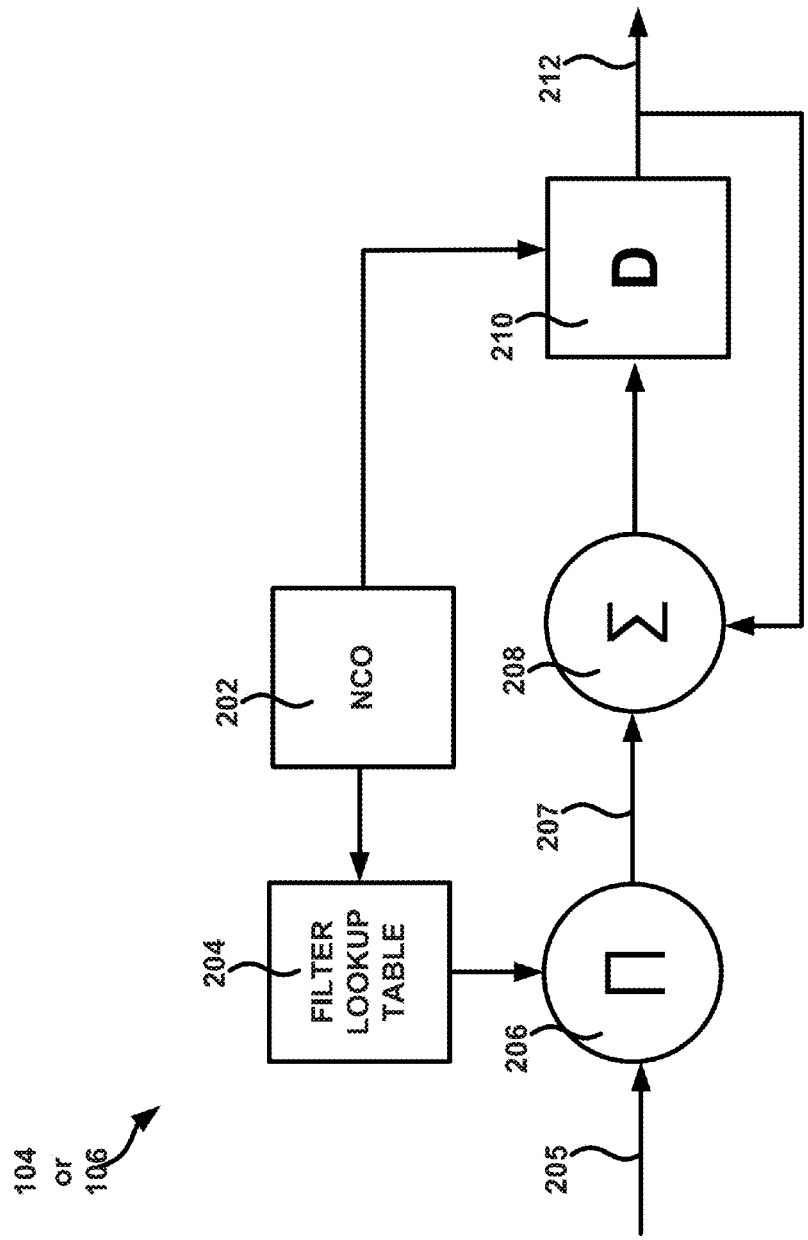
FIG. 2 shows a logical block diagram of an example of a sample rate converter.

FIG. 2 shows a logical block diagram of an example of a transmit or receive SRC 104 or 106. The transmit and receive SRCs 104 and 106 can run at a fixed clock rate, such as 1.2 GHz real.

An NCO 202 can control how fast a filter lookup table 204 provides filter coefficients to a multiplier 206. The multiplier can determine the product of the filter coefficient and a sampled signal 205. An adder 208 and a delay 210 (e.g., the combination can be considered an accumulator) can accumulate the results of the multiplication until the result is to be dumped, such as at or around the time a flag is generated by the NCO 202. The flag produced by the NCO 202 can indicate that the accumulated total has been dumped and stored as the received signal.

The multiplier 206 can perform a fixed point multiply. Multiplying a pair of two's complement numbers can be challenging. On solution to such multiplication can be to convert the numbers to sign-magnitude format and then multiply them. The task can be simplified if at least one of the multiplicands is already in sign-magnitude format. The multiplication of the magnitudes can be done separately from determining the sign. For example, the magnitudes could be multiplied, then the sign can be determined later, or vice versa.

The received samples can be received by the multiplier 206 in either sign-magnitude or binary format. A phase-rotate scaling 902 (see FIG. 9) operation upstream of the filtering can format the multiplicands, such as by putting them in sign-magnitude format. The phase-rotate scaling 902 can rotate the filter coefficients. The NCO 202 can control the phase-rotate scaling 902. The filter coefficient lookup table 204 can be loaded with an arbitrary number format. In one or more embodiments, a sign-magnitude format can be used for the filter coefficients ($h(\phi)$ 602 (see FIG. 6)) loaded into the filter coefficient lookup table 204.

The multiplicands (e.g., received signal and the filter coefficient) can be approximated by a fixed point number that has a precision dependent on the number of bits available to represent them. The product of two integers can grow the number of bits required to accurately represent the result (e.g., in multiplying 0.1*0.1=0.01, another decimal place can help accurately represent the result). Since the product will only have as many significant bits as the inputs, the lower half of the product can be discarded in this case. For example, when multiplying an 8-bit coefficient by an 8-bit received sample, the most significant 8-bits of the product can be retained and the rest can be discarded.

The product can be truncated or rounded to remove the unwanted least significant bits. In the case of truncating, the truncated products can be added with a carry-in on every other sample, a least significant bit bias can be cancelled. Using a rounding scheme can be simpler, while the truncating scheme includes more state information and the choice to toggle a carry-in on even or odd cycles. The accumulator can be large enough to hold the correlation results. When the symbol to sample ratio is small, there can be a large number of accumulates per dump. A larger accumulator can therefore help handle larger rate ratios.

Figure 3:
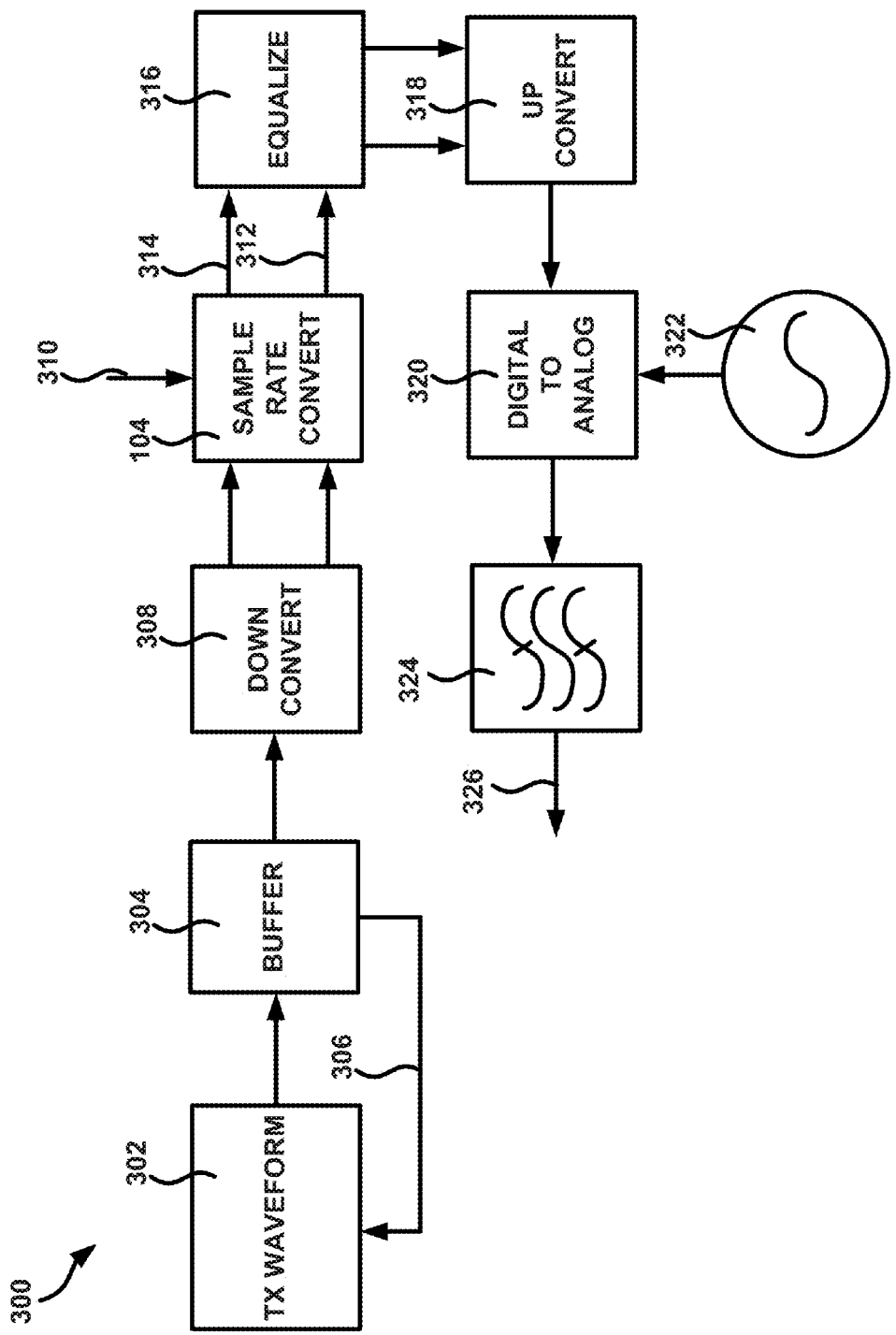
FIG. 3 shows a block diagram of an example of a transmit sample rate converter system.

FIG. 3 shows an example of a transmit SRC 104 system 300. A transmit waveform 302 can be received and sent to a buffer 304. The transmit waveform 302 can be an OQPSK waveform. Samples of the transmit waveform 302 can be sent to the buffer at about four times the real symbol rate. The buffer can indicate to the transmit waveform 302 sampler that it is ready for samples using signal line 306. The buffer 304 can send the signals to an optional down-converter 308. The down-converter can downconvert from sampling frequency to a baseband frequency, for example. In one or more embodiments, the down-converter 308 converts signals from a 276.48 MHz Intermediate Frequency (IF) to the baseband frequency. The downconverted or not downconverted samples can be sent to a transmit SRC 104. The transmit SRC 104 can function as described with regard to FIG. 2 or FIG. 4. The transmit SRC 104 can receive symbols from a filter look-up table on signal line 310. In one or more embodiments, the symbol rate is about 276.48/n MHz, where n=1, 2, 4, or 8.

The transmit SRC 104 can send In-Phase (I) and Quadrature (Q) signals to an optional equalizer 316 on signal lines 312 and 314, respectively. The I and Q signals can be sent from the equalizer 316 or the transmit SRC 104 to an up-converter 318. The up-converter 318 can produce real samples and send them to a D/A converter 320. In one or more embodiments, the real samples can be sent at four times the IF. The D/A converter 320 can be coupled to a clock 322. The clock 322 can run at a fixed frequency. In one or more embodiments, the fixed frequency can be about 1.2 GHz. The analog signals from the D/A converter 320 can be sent to a band-pass filter 324, which can produce the transmit signal 326. The D/A converter 320 can send a number of signals to the band-pass filter 324. In one or more embodiments, the D/A converter 320 sends twelve signals in parallel to the band-pass filter. The transmit signal can be a 300 MHz IF signal in one or more embodiments.

Figure 4:
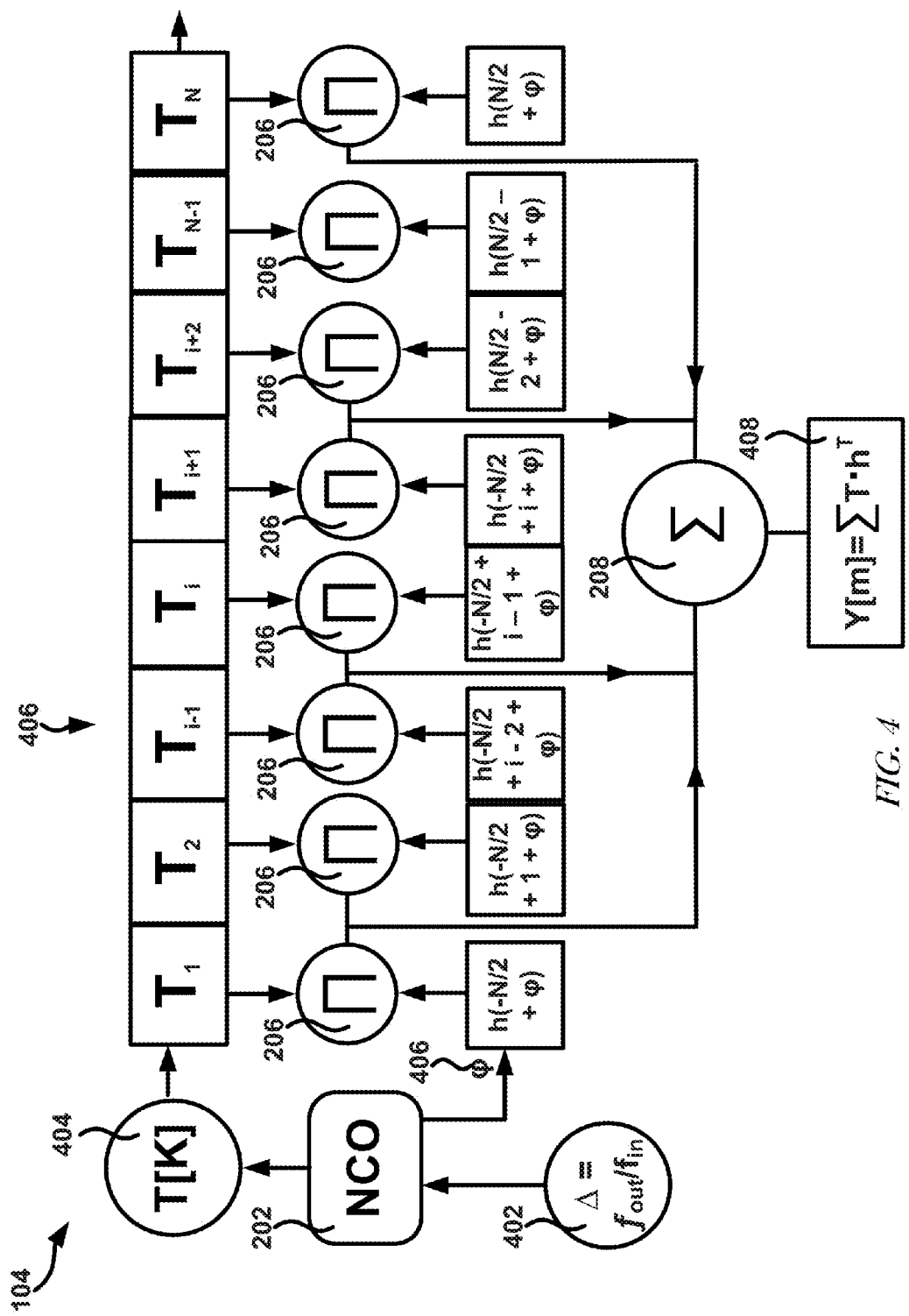
FIG. 4 shows a block diagram of an example of a transmit sample rate converter.

FIG. 4 shows an example of a transmit SRC 104 implementation. In one or more embodiments, it can be beneficial to relate a waveform rate (e.g., a waveform modem rate), which can be variable per High Data Rate Radio Frequency (HDR RF) specifications, to a fixed D/A converter 320 clocked sample rate. The sample rate can be 600 MHz for complex symbols in one or more embodiments. This can be accomplished by using a Digital Signal Processing (DSP) algorithm in which an NCO 202 is driven by a frequency word Δ, which is the ratio of the fixed frequency to the variable frequency rate. The NCO 202 can produce a request flag to pull a new sample into a length L shift register 406. The NCO 202 can produce a filter coefficient entry command that selects the appropriate filter coefficient(s) 602 to apply to the transmission sequence. The NCO 202 can be driven by the frequency word Δ 402, and the NCO 202 can produce a request to the transmit sequence T[K] 404 and provide filter table index ϕ 406 to select the appropriate coefficients for transmit SRC 104 filtering.

In the case of a transmit SRC 104 the waveform data to be transmitted can arrive at the transmit SRC 104 at its own independent rate. A transmit SRC can take the received signal and convert the signal to I and Q signals, such as at 600 MHz. There may not be a nice integer relation between the sampling rate (e.g., 1.2 GHz) and the received I and Q signal rate. A one Hertz data rate resolution can effectively preclude a nice integer relation between the two. A circuit can be built to re-sample to the I and Q rate of the received signal.

For example, consider transmitting an Offset Quadrature Phase Shift Keying (OQPSK) signal with one bit. A shaped Root-Raised Cosine (RRC) waveform with an alpha factor of about 0.3 can be desired. The waveform can provide complex samples at two times the symbol rate of 278.48 MHz. The samples can be down converted to baseband, such as by using down-converter 308 (see FIG. 3). The NCO 202 in the SRC 104 or 106 can request samples using a "flag" command and can place these requested samples in a shift register. The transmission signal portion in the shift register 406 (see FIG. 4) can be multiplied 206 by a stored filter shape from the filter look-up table 204. This can be done at the same rate as a Digital-to-Analog (D/A) 320 (see FIG. 3) sampling rate. The products can be accumulated in an output register 408. When the "flag" command is asserted again the shift register 406 can shift, moving the contents one register cell place (e.g., moving the contents of $T_1$ to $T_2$, $T_1$ to $T_2$, $T_{i-1}$ to $T_i$, etc.). In shifting the contents, the shift register 406 can dump the most significant element in the shift register and can insert the newest requested sample into the least significant cell (e.g., $T_1$ in this example).

By clocking the NCO 202 faster or slower the look up table 204 can be traversed faster or slower, respectively, and time dilation or compression of a shaped OQPSK pulse can be matched.

The transmit or receive SRC 104 or 106 can operate in two modes. Most of the time the transmit or receive SRC 104 or 106 can operate in accumulate mode, such as shown in FIG. 2. When it is time to output a symbol, the result of the integrate can be dumped and a new symbol accumulate can be started. This can be accomplished by feeding a zero into the adder 208 and reading the value of signal line 212.

Figure 5:
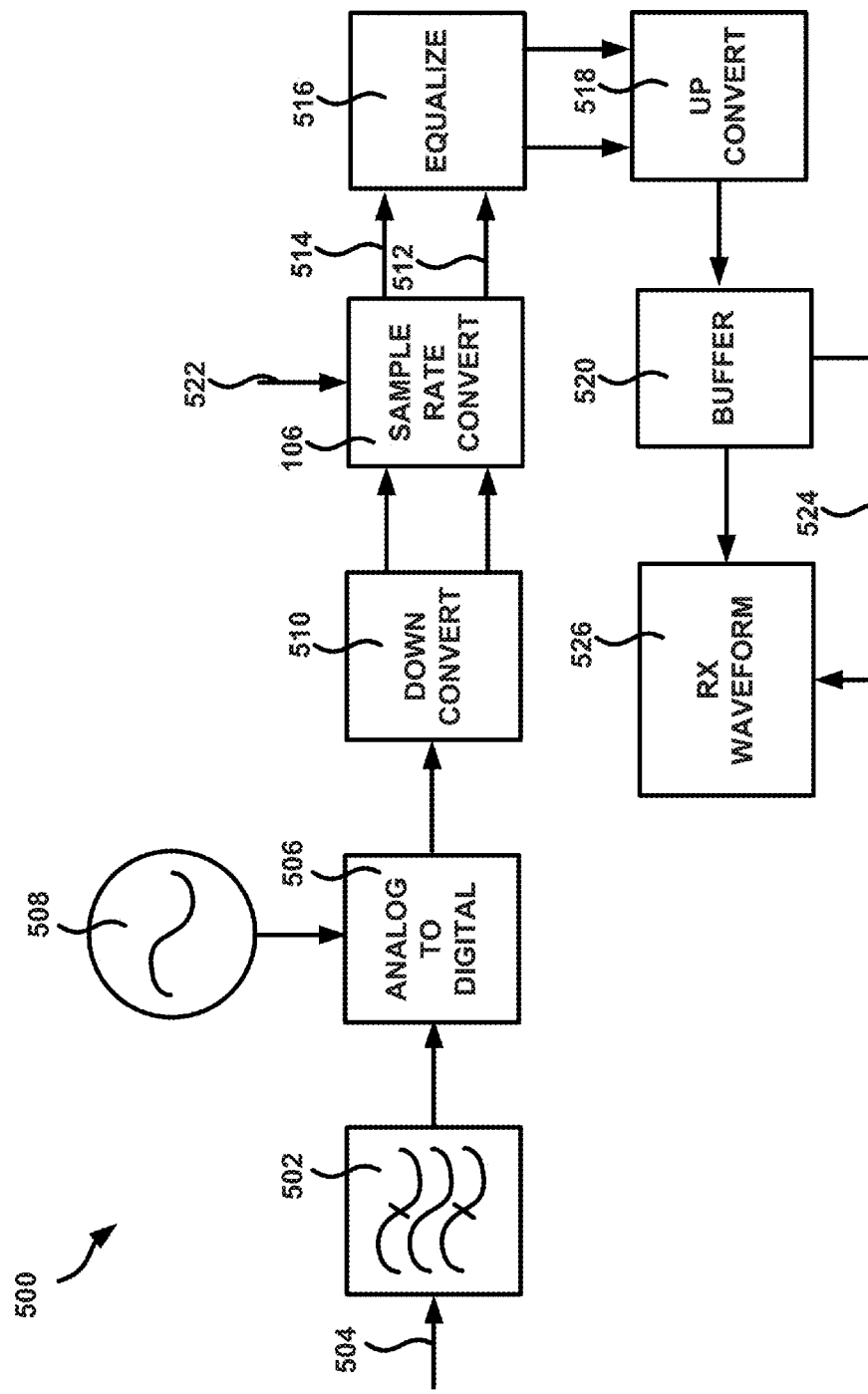
FIG. 5 shows a block diagram of an example of a receive sample rate converter system.

FIG. 5 shows an example of a receive SRC system 500. A signal can be received at a band-pass filter 502 on signal line 504. The band-pass filter 502 can send the band-pass filtered signal to an A/D converter 506. The A/D converter 506 can be driven by a clock 508. The clock 508 can use a fixed frequency clock. The clock 508 can run at the same frequency as the clock 322. In one or more embodiments, the clock can be a 1.2 GHz fixed sample clock. The A/D converter 506 can send a number of bits in parallel to a down-converter 510. In one or more embodiments, the A/D 506 converter sends eight bits in parallel to the down-converter 510. The down-converter 510 can down-convert the bits and send I and Q signals to a receive SRC 106. In one or more embodiments, the I and Q signals can be sent to the receive SRC 106 at 600 MHz.

Figure 6:
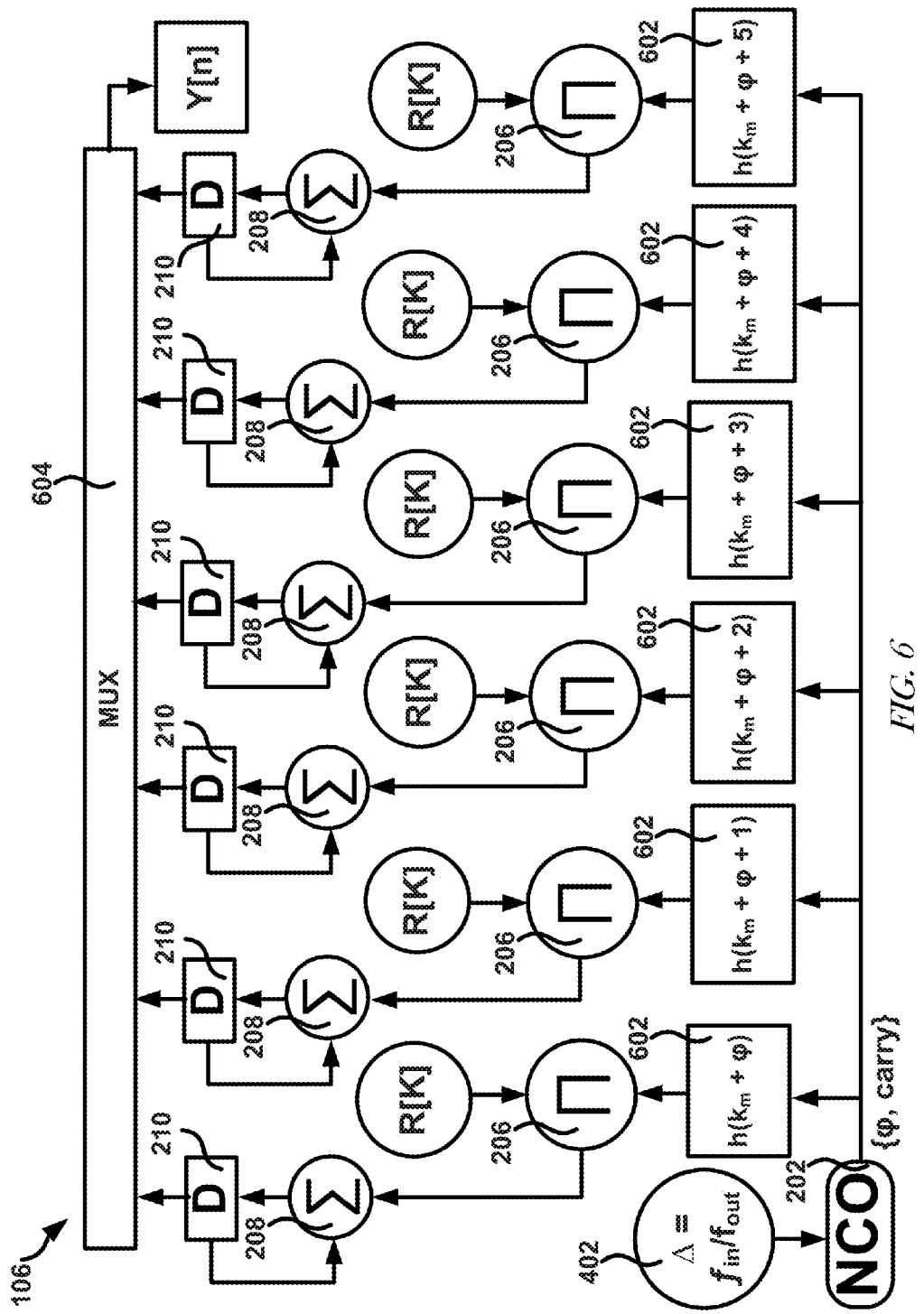
FIG. 6 shows a block diagram of an example of a receive sample rate converter.

The receive SRC 106 can function as described with regard to FIG. 2 or FIG. 6. The receive SRC 106 can receive one or more signals and convert it to a frequency at which a receive waveform module 526 operates. There is no guarantee of a nice (e.g., round) integer relation between the sampling and baud rate on the receive side. An integrate and dump circuit (e.g., an accumulator), such as shown in FIG. 2, can be built that re-samples to the baud rate of the receive waveform module 526 and provides matched filtering at the same time. In the example of HDR RF, this matched filter capability may not need to be exploited. Shaping pulses can be exploited to confine the signal spectrum, such as to use them as a low-pass filter. Signal shaping (e.g., filtering outside of the receive or transmit SRC 106 or 104) can be used to make a signal more spectrally efficient. For example, instead of sending a sequence of square pulses Gaussian pulses can be sent. Gaussian pulses have a more confined spectrum, whereas the square pulses require theoretically infinite spectrum.

The receive SRC 106 can receive symbols from a filter look-up table 204 on signal line 310. In one or more embodiments, the symbol rate is about 276.48/n MHz, where n=1, 2, 4, or 8. The receive SRC 106 can send I and Q signals to an optional equalizer 516 on signal lines 512 and 514, respectively. The I and Q signals can be sent from the equalizer 516 or the receive SRC 106 to an optional up-converter 518. The up-converter 518 can produce up-converted signals and send them to a buffer 520. In one or more embodiments, the real samples can be sent at four times the symbol rate of symbols sent to the receive SRC on line 522. The buffer 524 can indicate to the receive waveform module 526 that the samples are ready. In one or more embodiments, the receive waveform module 526 is an OQPSK receive waveform module. In one or more embodiments, the signal line 528 can be an Open Core Protocol (OCP) sink interface.

FIG. 6 shows an implementation of an example of a receive SRC system 600. The receive SRC system 600 can be an FIR filter. The receive SRC system 600 can correlate a fixed time window of L symbols, regardless of sampling rate, and dump a result every L symbols. In one or more embodiments, L can be on the order of five or six. When all of the symbols are to be kept and considered, L copies of the filter can be used. The filters can each operate at a time skew to help fill in the gaps between the symbols.

Now consider the case of demodulating an OQPSK signal of one bit. At the transmitter signal line, a shaped RRC waveform with alpha factor of about 0.3 can be produced. At the receiver, assuming correct timing provided by the NCO 202, the received signal can be multiplied by a stored shape. In one or more embodiments, the stored shape is another RRC waveform, wider in time than the OQPSK waveform, at the A/D converter 506 sample rate, defined by clock 508. The products can be accumulated in a register. An estimate of the transmitted signal can be read at the accumulator register. By clocking the NCO 202 faster or slower the stored waveform in the filter look-up table can be iterated through faster or slower, respectively. In this fashion a wide variety of time dilation or time compression of a shaped OQPSK pulse can be matched. Thus, the filter look-up table 204 combined with the NCO 202 can accommodate a wide variety of baud rates by adjusting the NCO 202 frequency word. The input speed at the A/D converter 506 can be constant at the clock 508 rate.

By truncating the SRC filter to L symbol periods in length, the system can integrate (e.g., sum) for L symbols, read out the contents of the accumulator, zero the accumulator, and get the next symbol. Thus, one correlator (e.g., a multiplier 206 that takes in a signal and multiplies by a filter coefficient) can be capable of producing a symbol snapshot 207 every $L^{th}$ modulation symbol. Since there are L modulation symbols, L copies of FIG. 2 can be run in parallel with a timing offset of one symbol between them. One of the correlators can capture every modulation signal. Brute force copying the correlator can include significant redundancy in the filter coefficient look up table 204. The resulting structure can be rearranged to reduce duplicate information.

Given a bank of L correlators, let the first look-up table cover the first 1/L of the pulse shape, the next correlator cover the second 1/L of the pulse and so on. Now when 1/L of the signal has been processed in the first correlator, move the contents of the accumulator to the second correlator to pick up the second 1/L. Each correlator bumps the contents of its accumulator to the next one in line. A zero is can then be fed into the first correlator. The last will produce a snapshot of the modulator at or around the on-time moment. An example result of using this process can be seen in FIGS. 7 and 8.

The NCO 202 can translate fixed D/A converter clock 322 or A/D clock 508 timing into waveform over-sampled signal timing or vice versa. While the conversion clocks can assume integer values, the waveform signal may have fractional timing. Let $F_{clk}$ be the fixed clock rate. This can be the clock rate of the device 102A or 102B or some submultiple thereof. This example considers how such a system would be implemented in an HDR RF ground modem, so a 600 MHz complex clock rate is assumed for conversion circuitry. Let $F_{sym}$ be two times the OQPSK symbol or chip rate of the waveform signal. Let $\Delta=F_{clk}/F_{sym}$. $\Delta$ will be between zero and 1. $\Delta$ can be represented by a number of bits, 2, 4, 8, 16, 32, 64, etc., or other number of bits. Let L be the length, in symbols, of a filter. Each filter can produce an output every L symbols. L filters can be used to reconstruct the symbols.

Let $\phi(k)$ be the NCO 202 accumulator total at time k for all L filters. On every clock tick, $\Delta$ can be added to the NCO accumulator so that $\phi(k+1)=\phi(k)+\Delta$. If $\phi<L$, the accumulator can remain in accumulate mode as shown in FIG. 2. If $\phi \geq L$, then the integer portion of the timing word can be reset (e.g., $\phi=\phi-L$) and the accumulator result can be dumped.

For Example, let L=6, $\Delta=0.77$, and let $\phi(0)=0.00$. Then the accumulator sequence will be 0.00, 0.77, 1.54, 2.31, 3.08, 3.85, 4.62, 5.39, and 0.16. During the first eight clock ticks, the accumulate operation can be performed. On the next tick, 6.16 can be "wrapped back" to 0.16 and a dump can be performed. The NCO 202 can output the signal timing word $\phi(k)$ as a fixed (binary) point number $\phi \in [0,1)$. While the NCO itself can keep track of many bits, the word for filter coefficient lookup can be a subset of the bits that the NCO 202 is keeping track of. In one or more embodiments, four or five bits can be used to look up the filter coefficients 602.

The filter can accommodate a wide variety of baud rates by adjusting the NCO 202 frequency word, while the input speed remains constant at an Analog-to-Digital (A/D) clock rate.

Figure 7:
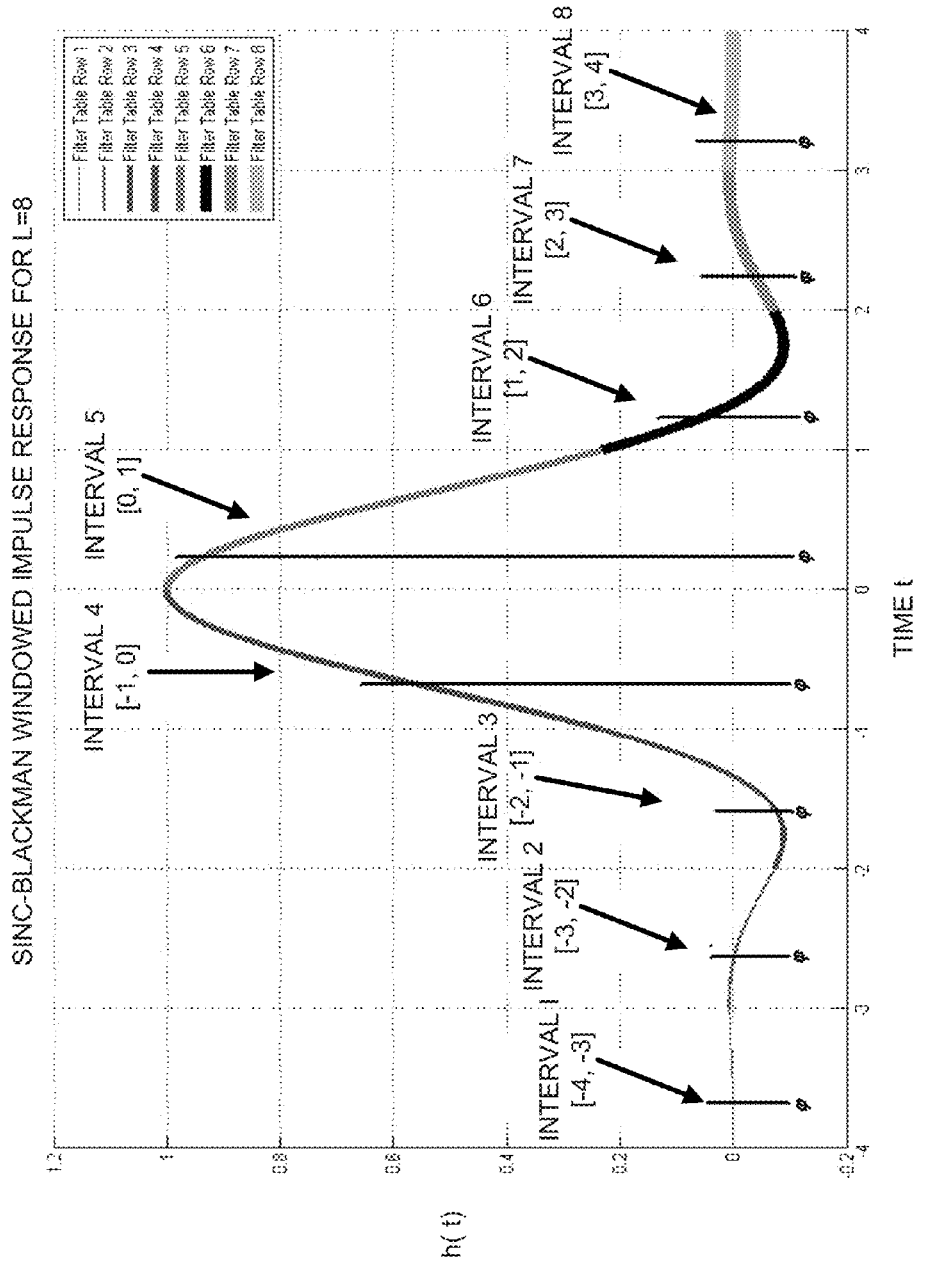
FIG. 7 shows a line graph of an example of a Sinc-Blackman windowed impulse response.
Figure 8:
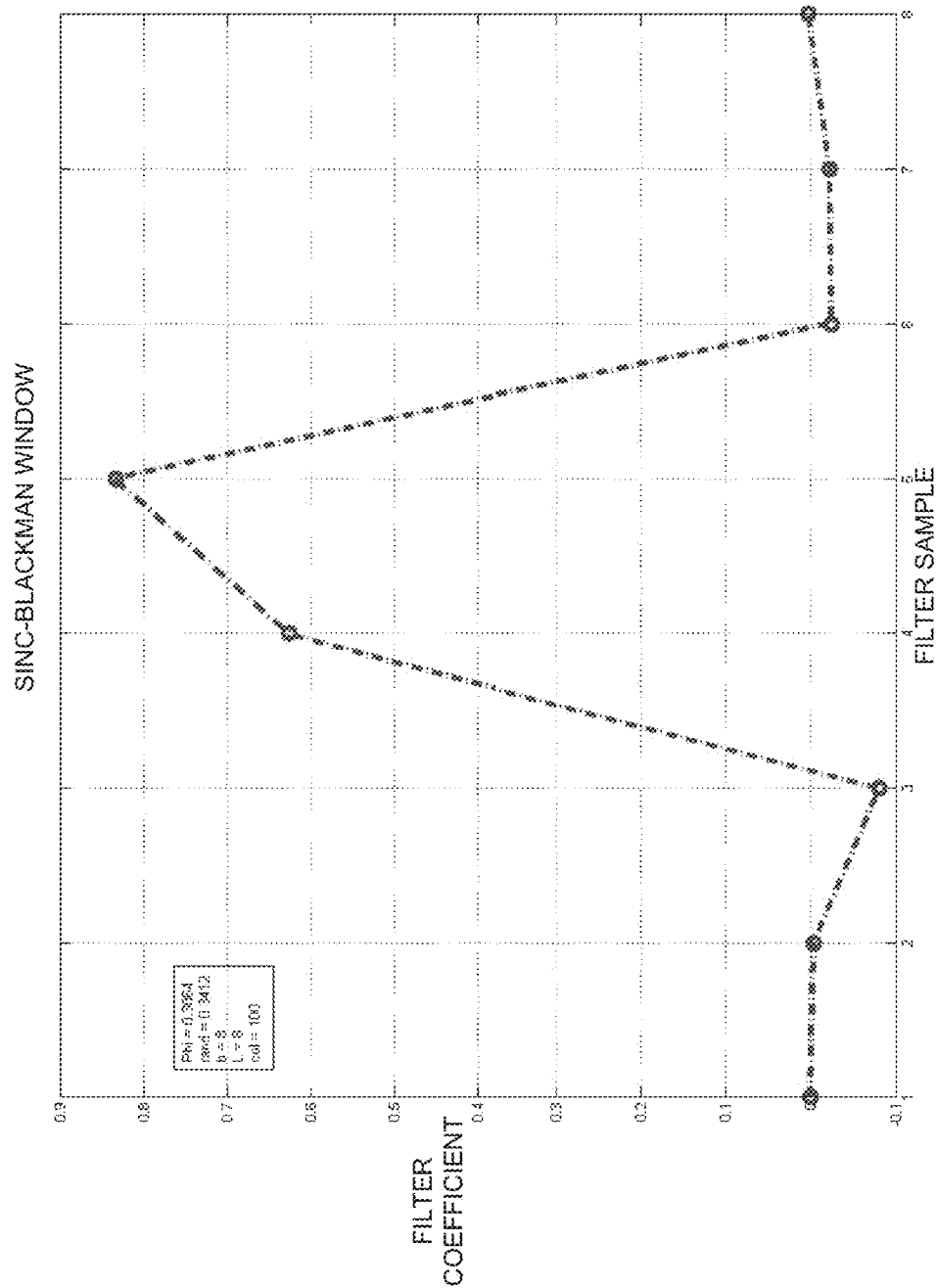
FIG. 8 shows a line graph of an example of plotted coefficients to implement a Sinc-Blackman windowed impulse response.

A filter response $h(\phi)$ 602 can be fetched at time $\phi$ for each entry in the filter table. The value of $\phi$ can be computed per clock tick by adding the frequency word to it each clock tick. The timing generation of $\phi$ can be given in terms of clock ticks, while the output rate can be given in terms of sample ticks. While it is possible to calculate the filter response on the fly, it can be more efficient to get the number from the filter look-up table 204. The table can have length L symbols and each symbol can be subdivided into $2^b$ time quanta, where b is the number of bits of subsampling. The table of filter coefficients 204 can be loaded such that each of the L rows corresponds to a time interval of length $2^b$. With this structure, when a value of $\phi$ is generated by the NCO 202, the transmit or receive SRC 104 or 106 can fetch the filter coefficients $h_j(\phi)$, where j is the column of the filter coefficient lookup table 204. The collection of filter coefficients $\{(h_j(\phi)\}$ can be used to correlate the received symbol sequence. The collection of all the intervals yields a Finite Impulse Response (FIR) filter. FIGS. 7 and 8 illustrate outputs from such a filtering scheme.

The coefficients can be retrieved from the column using a floor function: floor $\{2^b \cdot \phi + rand\}+1$, where rand can be a uniformly distributed number between zero and one. Rand can be used to provide dithering in the filtering. In this example, $\phi=0.3864$, rand=0.3412, and $2^b=256$, which yields column 100 of the filter lookup table 204. The coefficients in column 100, in this example are {0.0008−0.0030−0.0810 0.6260 0.8335−0.0241−0.0221 0.0028}. A plot of these coefficients can be seen in FIG. 8. For many filters, the tails can fall off in magnitude (e.g., the tails can be close to zero) and data savings can be gained by using fewer bits at the tails of the filter. Since these coefficients can be used in a multiplication operation, a sign-magnitude format can be used in storing the coefficients. The same table of filter coefficients 204 can be used by each of the L parallel filters. One can replicate the entire table of filter coefficients 204 for each filter. The relationship of the NCO 202 timing words can be exploited to combine the tables into one table.

FIG. 9 shows an example of coefficient look up table structures 900A, 900B, and 900C. Note that, in the examples shown in FIG. 9, $\phi_j=\phi$ for all j $\in Z$. For a particular filter, the coefficient $h(\phi)$ 602 can be looked up in the coefficient lookup table 204. The filter lookup table 204 can cover multiple symbols. In this example, L=3. Rather than build three separate tables, see 900A or multiport one table, see 900B, the table of coefficients can be divided into L tables of one symbol period lengths. In this way, the common fractional part cp can be used to look-up L coefficient words simultaneously.

FIGS. 10A, 10B, 11A, 11B, 12A, 12B, and 13 show results from an example of a transmit SRC 104.

Figure 10A:
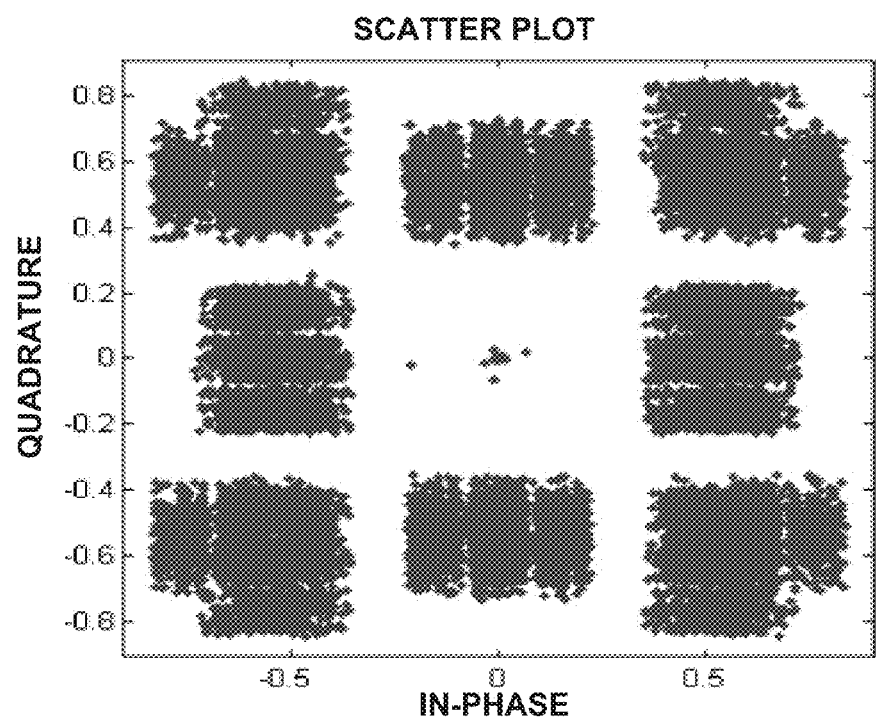
FIG. 10A shows an example of a scatter plot of input filtered symbols from a transmit sample rate converter.

FIG. 10A shows a scatter plot of in-phase vs. quadrature results from a transmit SRC 104. The results shown are from transmit SRC 104 input filtered OQPSK symbols.

Figure 10B:
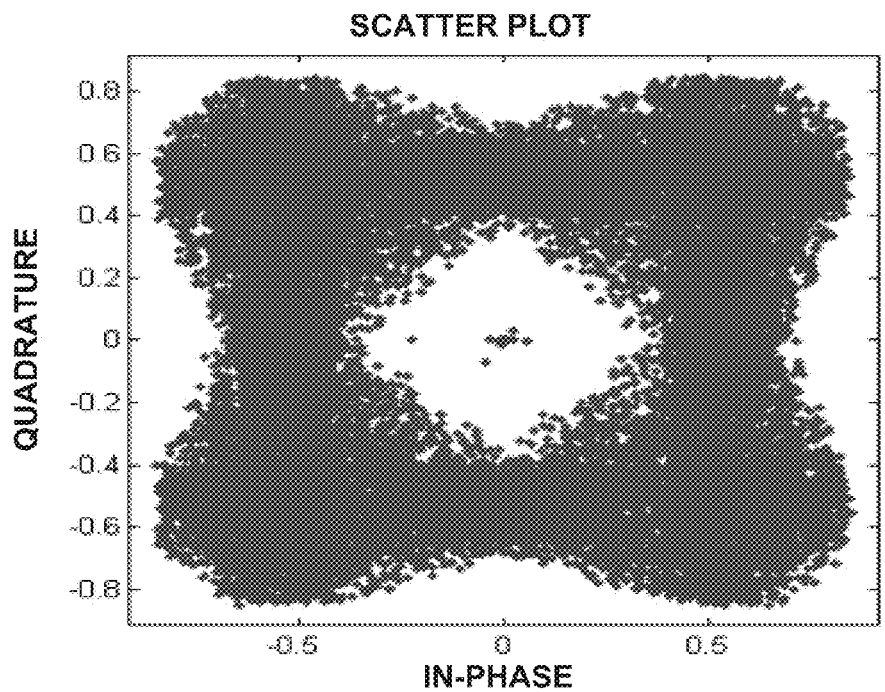
FIG. 10B shows an example of a scatter plot of transmit sample rate converter output symbols.

FIG. 10B shows a scatter plot of in-phase vs. quadrature results from a transmit SRC 104. The results shown are from a transmit SRC 104 output of unsampled OQPSK symbols. As can be seen in the scatter plots, the transitions are not through the origin of the In-Phase (I) and Quadrature (Q) plane. This is because OQPSK modulation is being used.

Figure 11A:
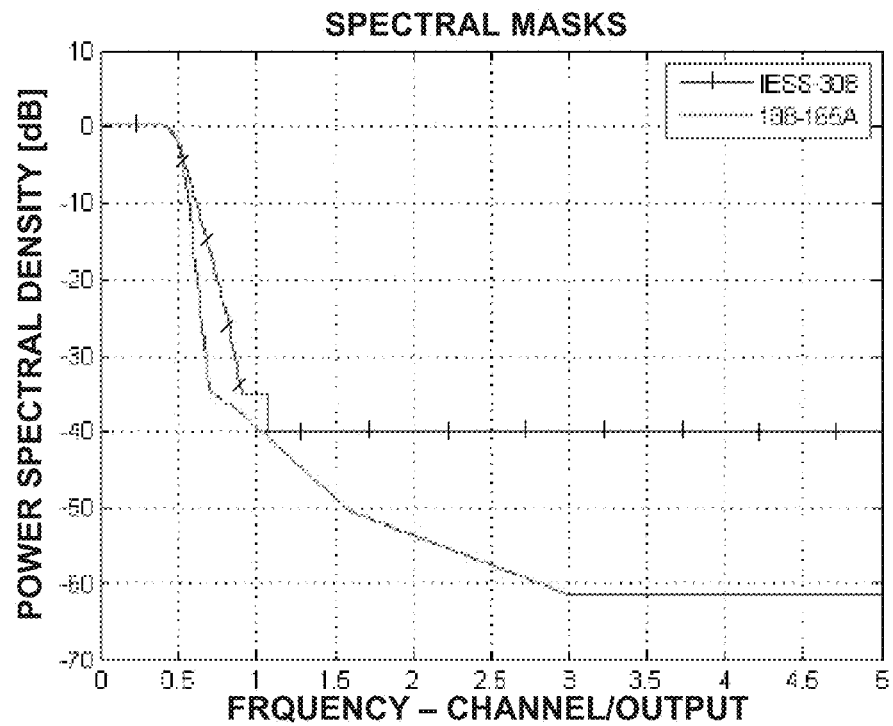
FIG. 11A shows a line graph of examples of spectral masks.

FIG. 11A shows a line graph plot of spectral masks for the IESS-308E and MIL-STD-188-165A standards. A device 102, such as an HDR RF ground modem, can meet the IESS-308E standard for data rates over 50 Mbps. For data rates at or below 50 Mbps the MIL-STD-188-165A spectral mask standard can be met. The IESS-308E and MIL-STD-188-165A spectral mask standards are plotted with respect to a channel rate of 600 MHz complex symbols.

Figure 11B:
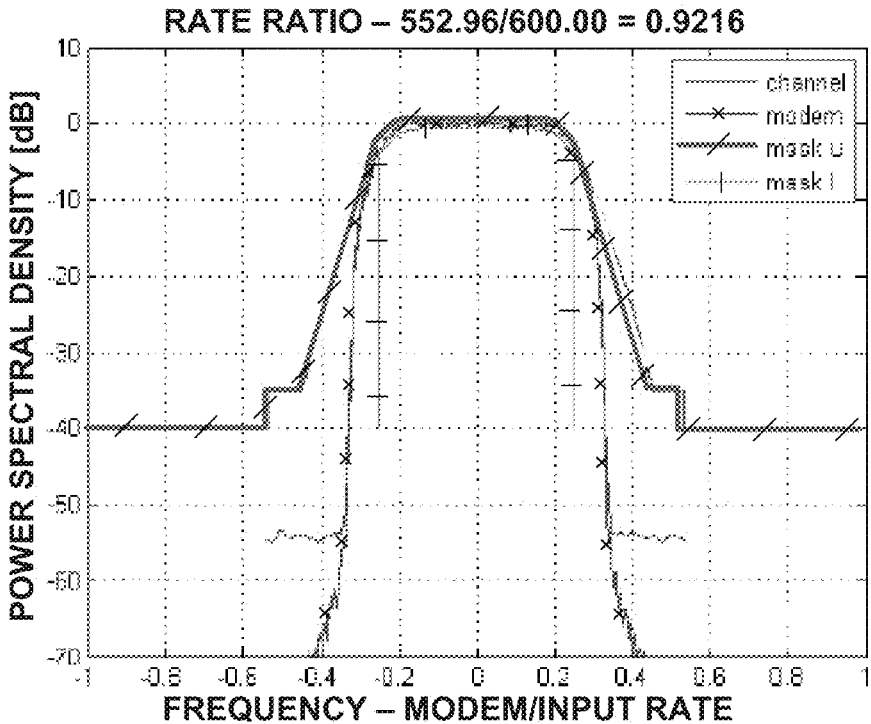
FIG. 11B shows an example of a line graph of the power spectrum of a transmit sample rate converter with respect to an input rate.

FIG. 11B is a line graph of frequency with respect to modem or input rate vs. power spectral density in dB. The rate ratio in this example is 0.9216 since the modem rate in this example is 552.96 MHz and the channel rate is 600.00 MHz. FIG. 11B demonstrates that an unsampled OQPSK shape can fit within the spectral masks shown in FIG. 11A. Mask "U" in FIG. 11B corresponds to the IESS-308E upper bound spectral mask and mask "I" in FIG. 11B corresponds to the lower bound of the spectral mask of the IESS-308E standard.

Figure 12A:
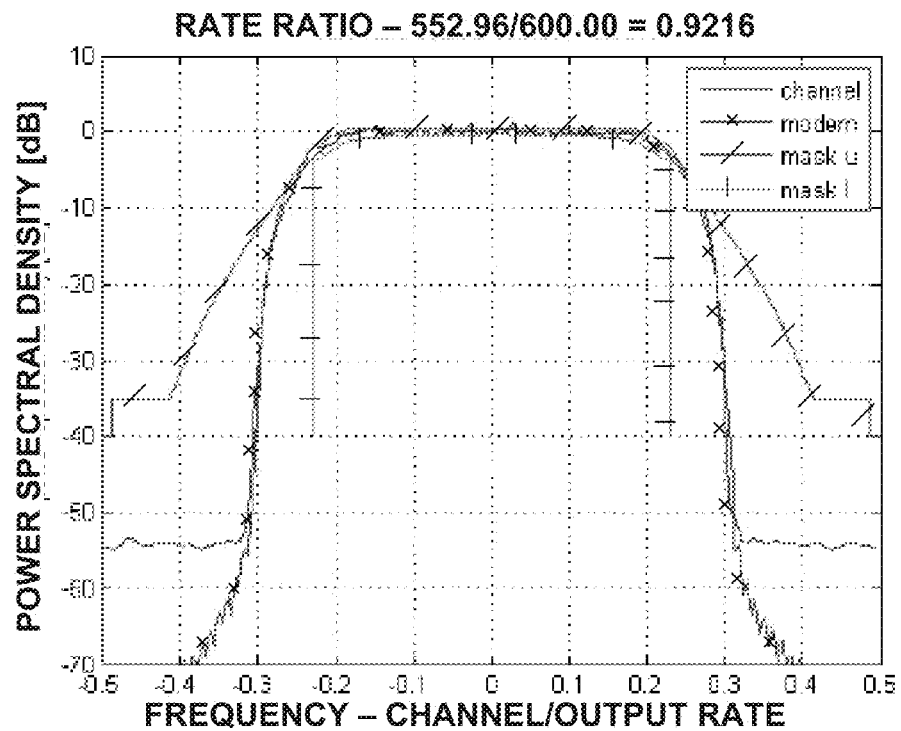
FIG. 12A shows an example of a line graph of the power spectrum of a transmit sample rate converter with respect to a fixed digital to analog converter clock rate.

FIG. 12A is a line graph of frequency with respect to channel or output rate vs. power spectral density in dB. Similar to FIG. 11B, this graph demonstrates that the unsampled OQPSK shape can fit within the spectral mask of the IESS-308E shown in FIG. 11A.

Figure 12B:
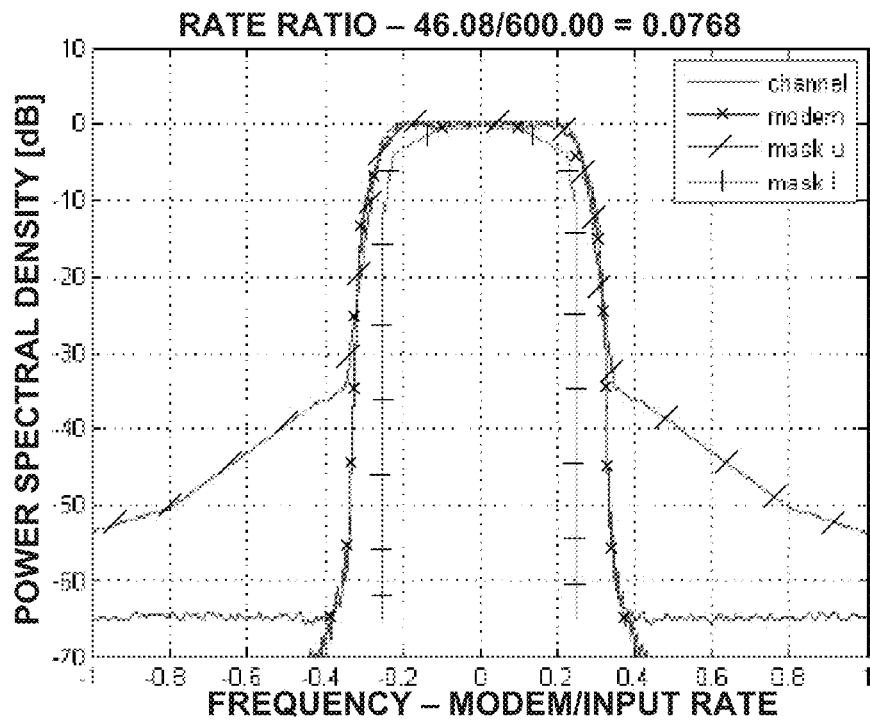
FIG. 12B shows an example of a line graph of the power spectrum of a transmit sample rate converter with respect to an input rate.

FIG. 12B is a line graph of frequency with respect to modem or input rate vs. power spectral density in dB. The rate ratio in this example is 0.9216 since the modem rate in this example is 46.08 MHz and the channel rate is 600.00 MHz. FIG. 12B demonstrates that an unsampled OQPSK shape can fit within the spectral mask for the MIL-STD-188-165A shown in FIG. 11A. Mask "U" in FIG. 12B corresponds to the MIL-STD-188-165A spectral mask upper bound and mask "I" in FIG. 11B corresponds to the MIL-STD-188-165A spectral mask lower bound.

Figure 13:
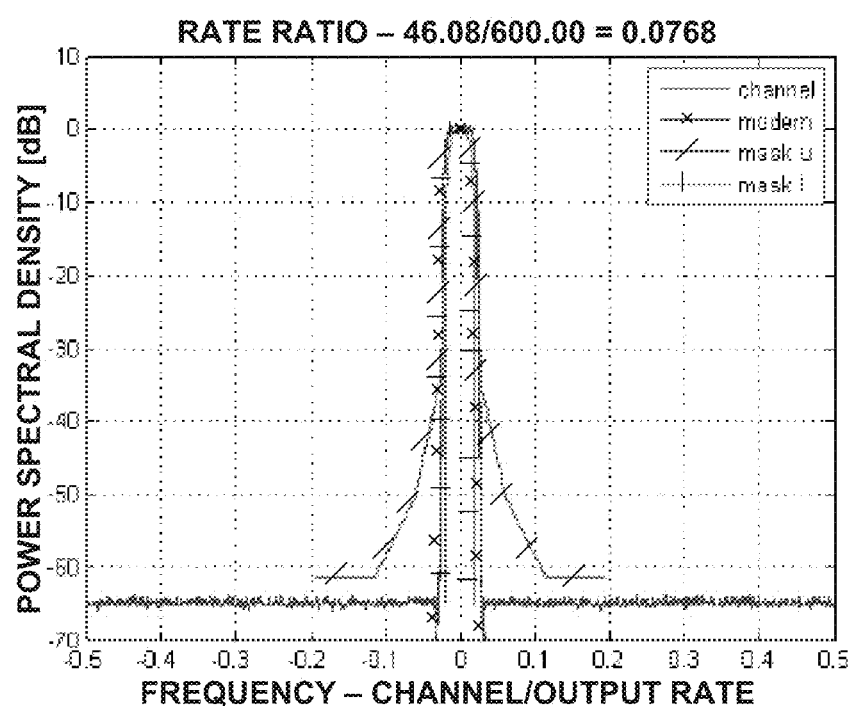
FIG. 13 shows an example of a line graph of the power spectrum of a transmit sample rate converter with respect to a fixed digital to analog converter clock rate.

FIG. 13 is a line graph of frequency with respect to channel or output rate vs. power spectral density in dB. Similar to FIG. 12B, this graph demonstrates that the unsampled OQPSK shape can fit within the spectral mask of the MIL-STD-188-165A standard shown in FIG. 11A.

Figure 14:
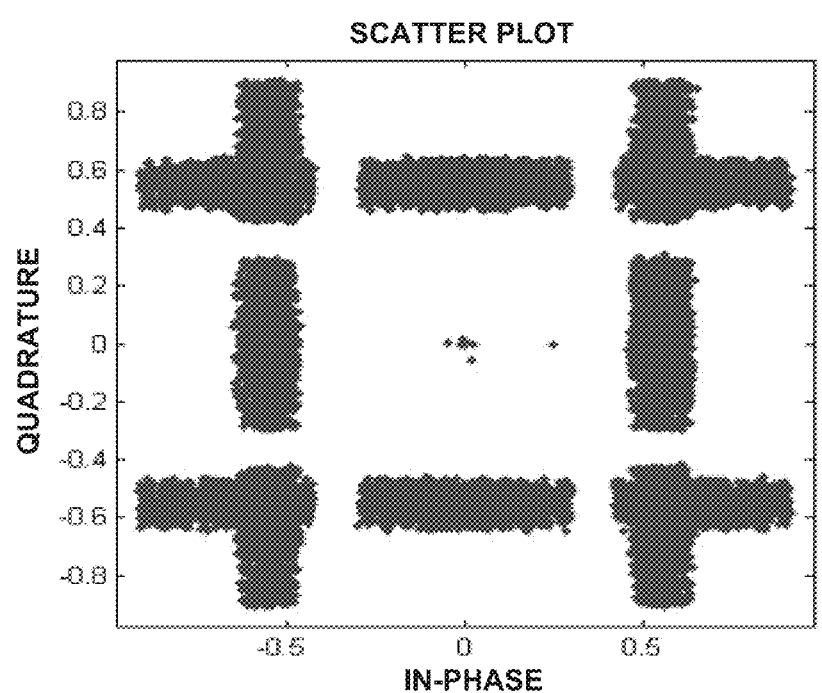
FIG. 14 shows an example of a scatter plot of receive sample rate converter output symbols.
Figure 15A:
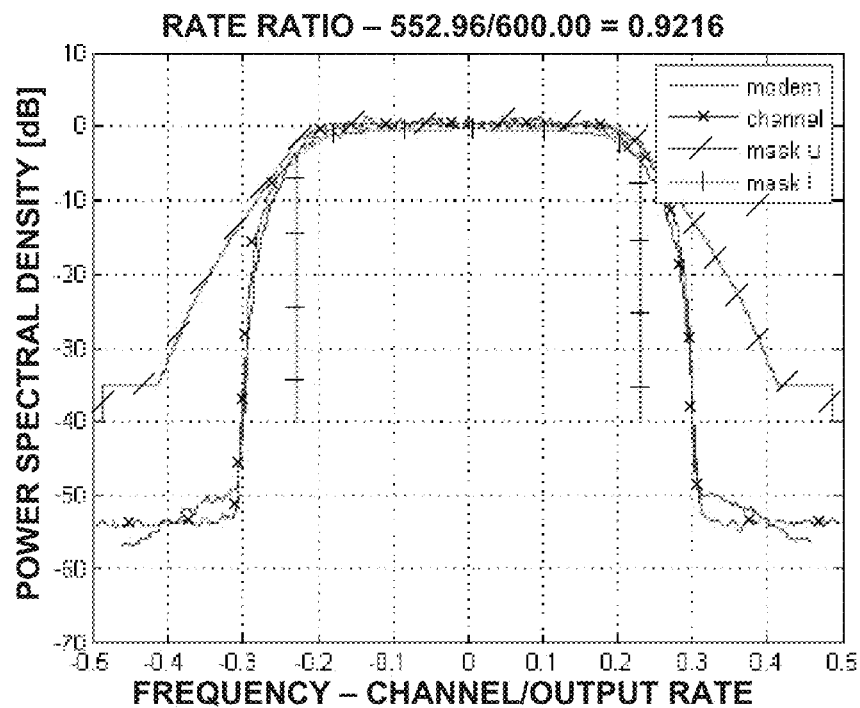
FIG. 15A shows an example of a line graph of the power spectrum of a receive sample rate converter input with respect to a fixed analog to digital converter clock rate.
Figure 15B:
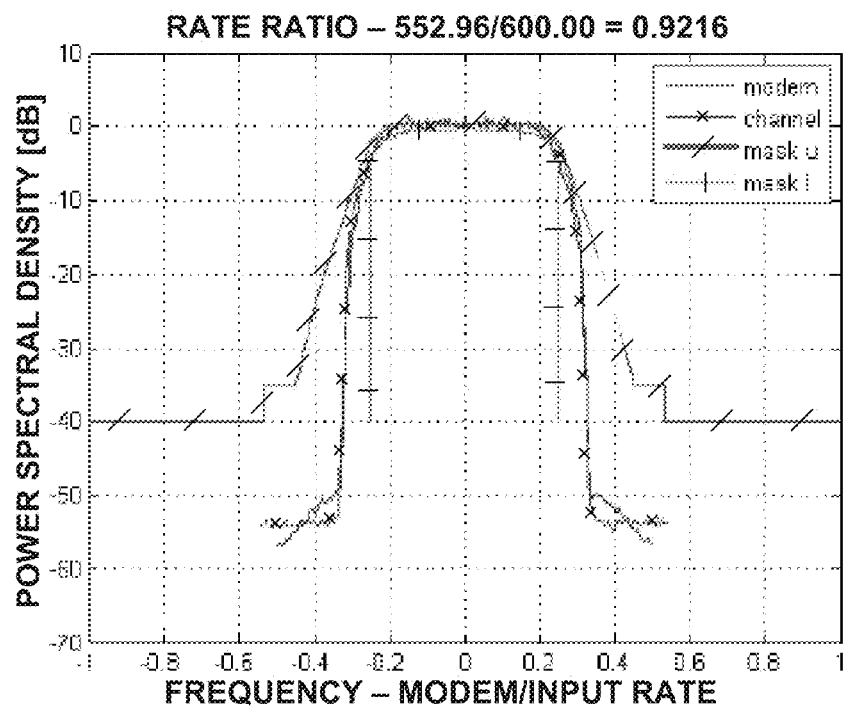
FIG. 15B shows an example of a line graph of the power spectrum of a receive sample rate converter output with respect to an output rate.

FIGS. 14, 15A, and 15B show results from an example of the system 500.

FIG. 14 shows a scatter plot of I vs. Q from a receive SRC 106. Time compensated and demodulated data was provided to the receive SRC 106 to emulate timing, phase recovery, and demodulation. It can be seen that the OQPSK shape can be tended to by the input waveform.

FIG. 15A is a line graph of frequency with respect to channel or output rate vs. power spectral density in dB. The power spectrum of the receive SRC 106 is shown with respect to a fixed A/D clock ??? in FIG. 15A. Similar to FIG. 11B, this graph demonstrates that the unsampled OQPSK shape can fit within the spectral mask of the IESS-308E shown in FIG. 11A, mask "U" in FIG. 15A.

FIG. 15B is a line graph of frequency with respect to modem or input rate vs. power spectral density in dB. The power spectrum of the receive SRC 106 is shown with respect to a fixed A/D clock 522 in FIG. 15B. Similar to FIG. 11B, this graph demonstrates that the unsampled OQPSK shape can fit within the spectral mask of the IESS-308E shown in FIG. 11A, mask "U" in FIG. 15B.

FIGS. 16A, 16B, 17A, 17B, 18A, and 18B show examples of line graphs and scatter plots representative of an output of a system that uses fixed point filter coefficients and satisfies the IESS-308E standard spectral mask.

Figure 16A:
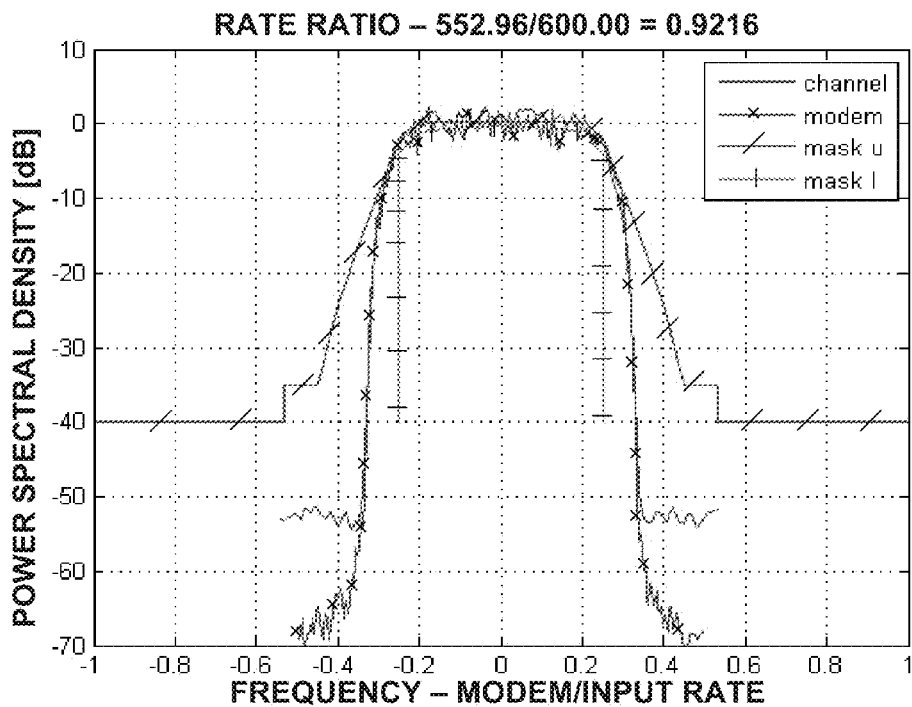
FIG. 16A shows an example of a graph similar to FIG. 11B with fixed point numbers used for filter coefficients in a transmit sample rate converter.
Figure 16B:
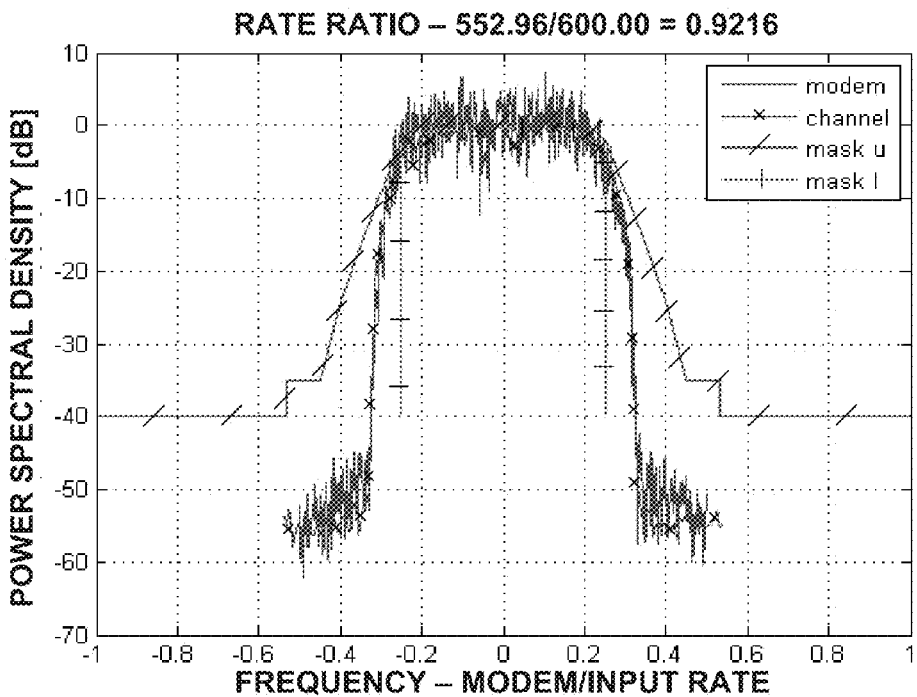
FIG. 16B shows an example of a graph similar to FIG. 15B with fixed point numbers used for filter coefficients in a receive sample rate converter.
Figure 17A:
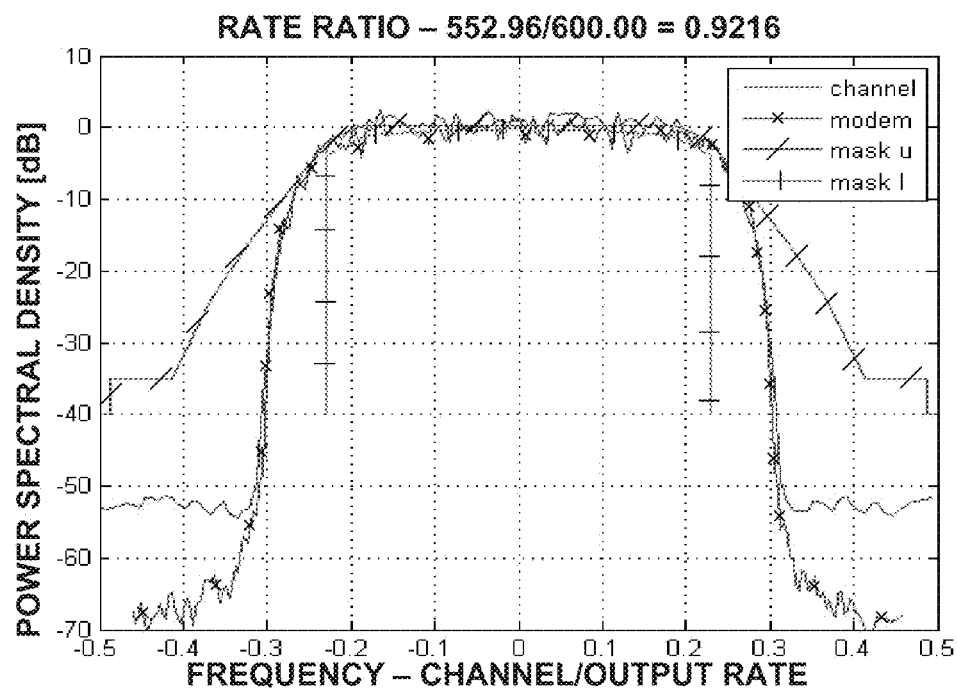
FIG. 17A shows an example of a graph similar to FIG. 12A with fixed point numbers used for filter coefficients in a transmit sample rate converter.
Figure 17B:
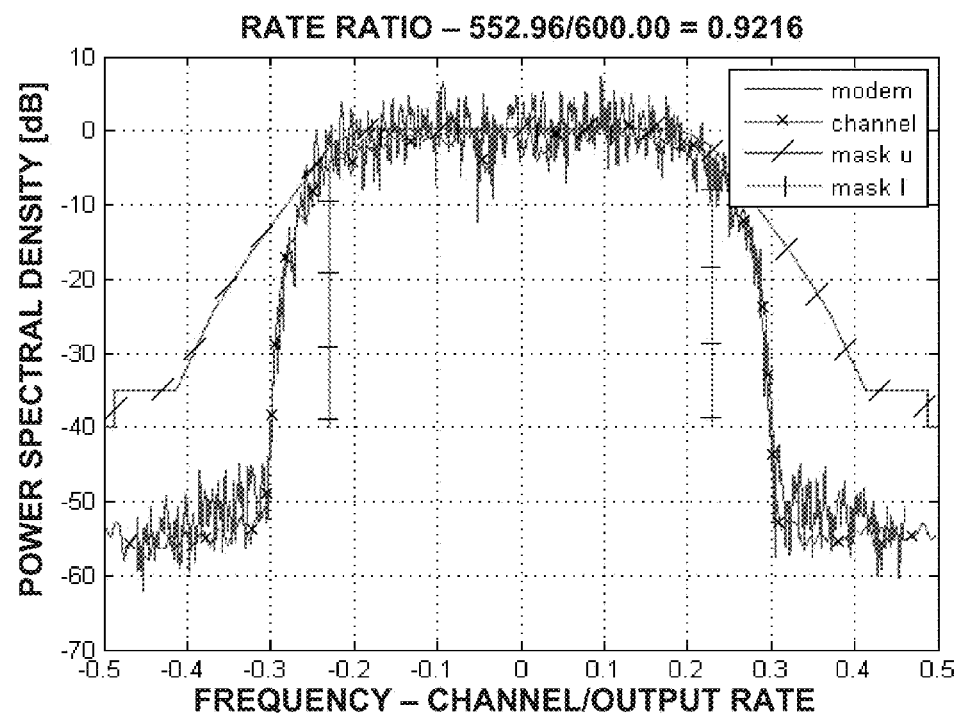
FIG. 17B shows an example of a graph similar to FIG. 15A with fixed point filter coefficients in a receive sample rate converter.

FIG. 16A shows a graph similar to FIG. 11B with fixed point numbers used for filter coefficients in a transmit SRC 104. FIG. 16B shows a graph similar to FIG. 15B with fixed point numbers used for filter coefficients in a receive SRC 106. FIG. 17A shows a graph similar to FIG. 12A with fixed point numbers used for filter coefficients in a transmit SRC 104. FIG. 17B shows a graph similar to FIG. 15A with fixed point filter coefficients in a receive SRC 106.

Figure 18A:
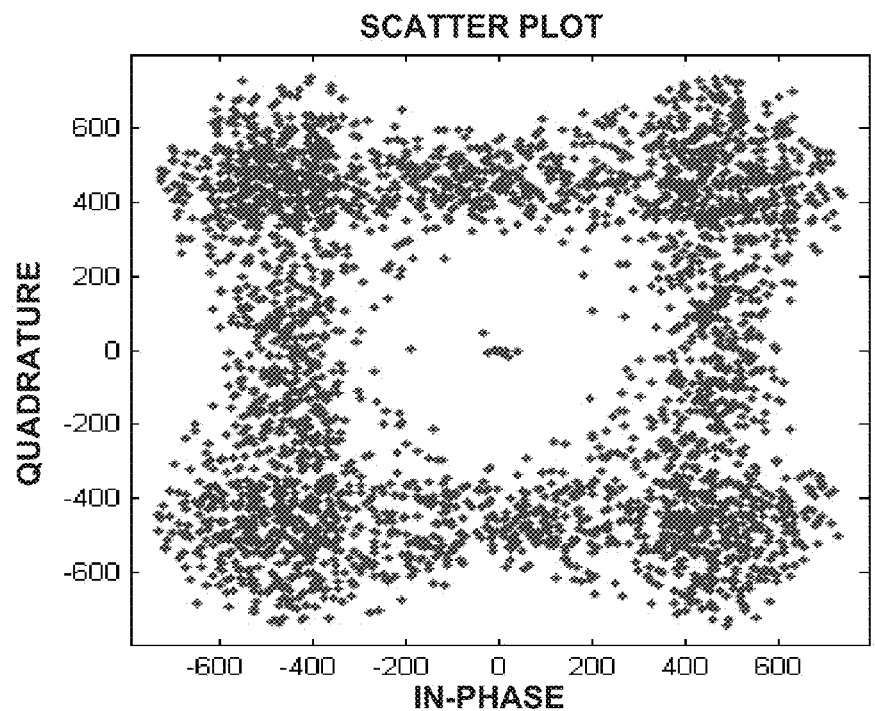
FIG. 18A shows an example of a scatter plot of in-phase vs. quadrature from a transmit sample rate converter.
Figure 18B:
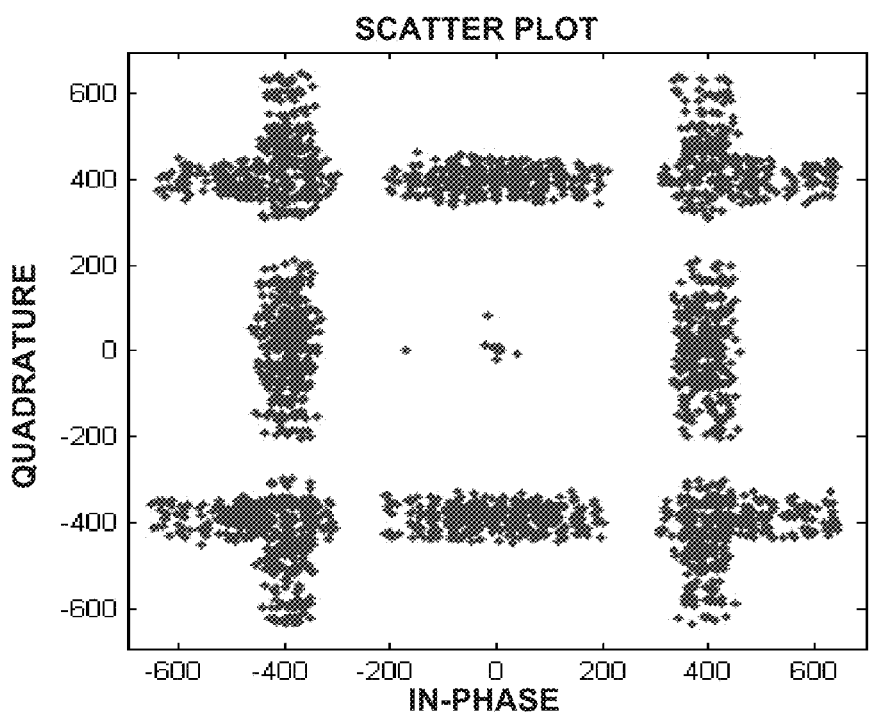
FIG. 18B shows an example of a scatter plot of in-phase vs. quadrature from a receive sample rate converter.

FIG. 18A shows a scatter plot of I vs. Q from a transmit SRC 104 OQPSK transmission using 11 bit filter coefficients. FIG. 18B shows a scatter plot of I vs. Q from a receive SRC 106 OQPSK transmission using 11 bit filter coefficients.

Figure 19A:
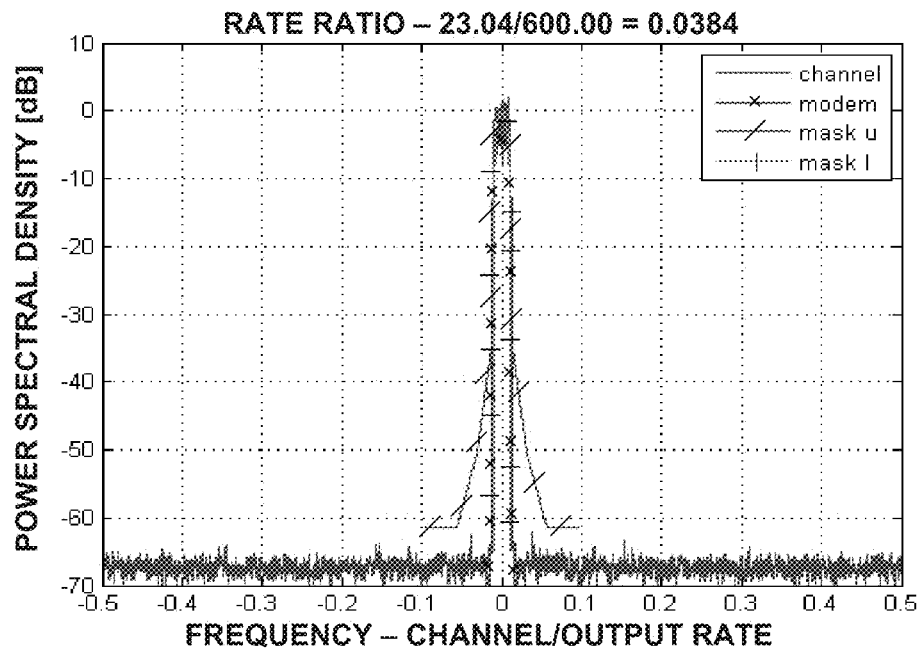
FIG. 19A shows an example of a line graph similar to FIG. 13 with fixed point numbers used for filter coefficients in a receive sample rate converter.
Figure 19B:
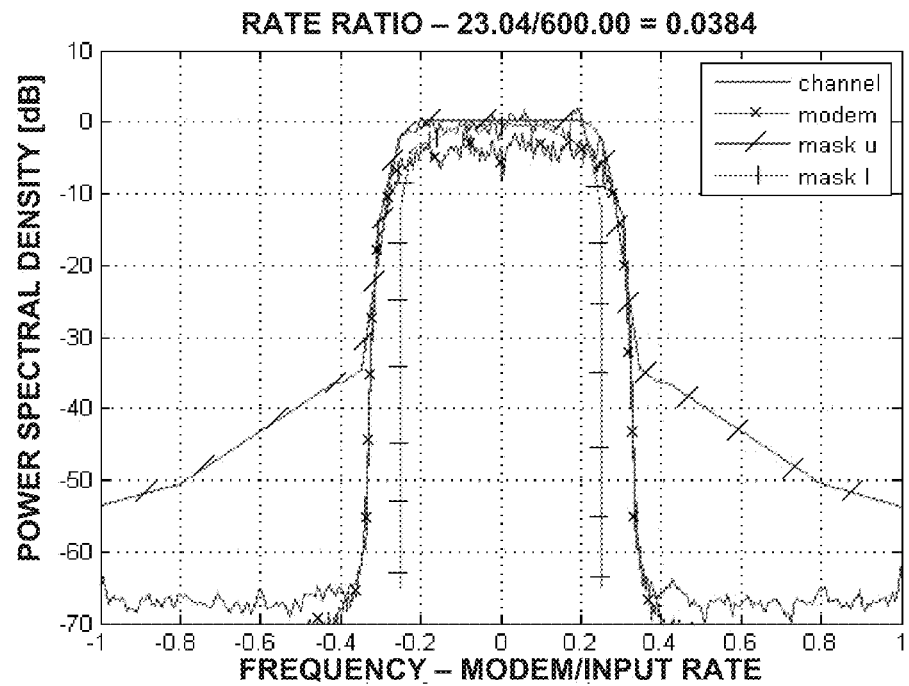
FIG. 19B shows an example of a line graph similar to FIG. 12B with fixed point numbers used for filter coefficients in a transmit sample rate converter.
Figure 20:
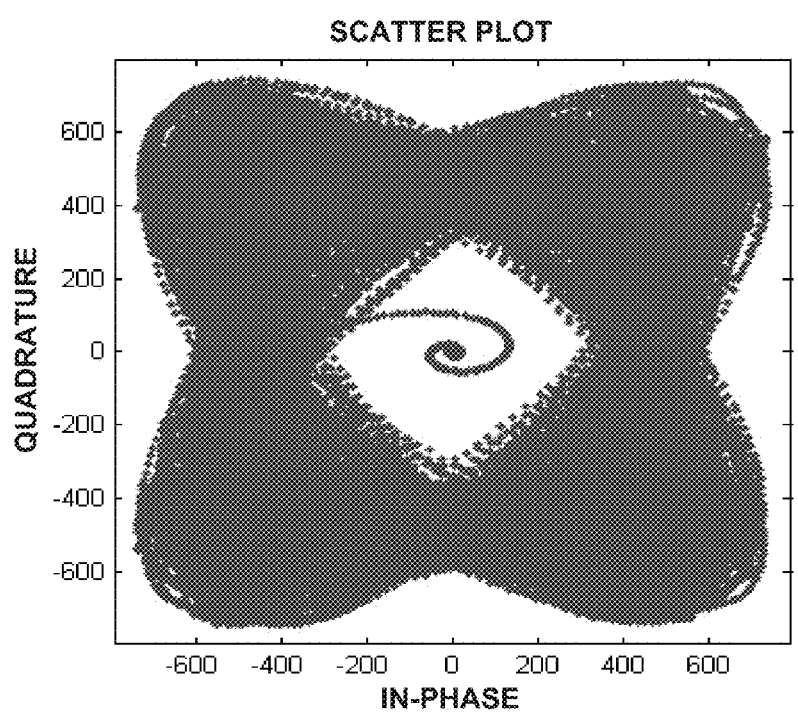
FIG. 20 shows an example of a scatter plot of in-phase vs. quadrature from a transmission from a receive sample rate converter.

FIGS. 19A, 19B, and 20 show examples of line graphs and scatter plots representative of an output of a system that uses fixed point filter coefficients and satisfies the MIL-STD-188-165A standard spectral mask, which can be more stringent than the IESS-308E standard.

FIG. 19A is similar to FIG. 13 with fixed point numbers used for filter coefficients in a receive SRC 106. FIG. 19B is similar to FIG. 12B with fixed point numbers used for filter coefficients in a transmit SRC 104. FIG. 20 shows an I vs. Q scatter plot of a transmission from a receive SRC 106.

Figure 21:
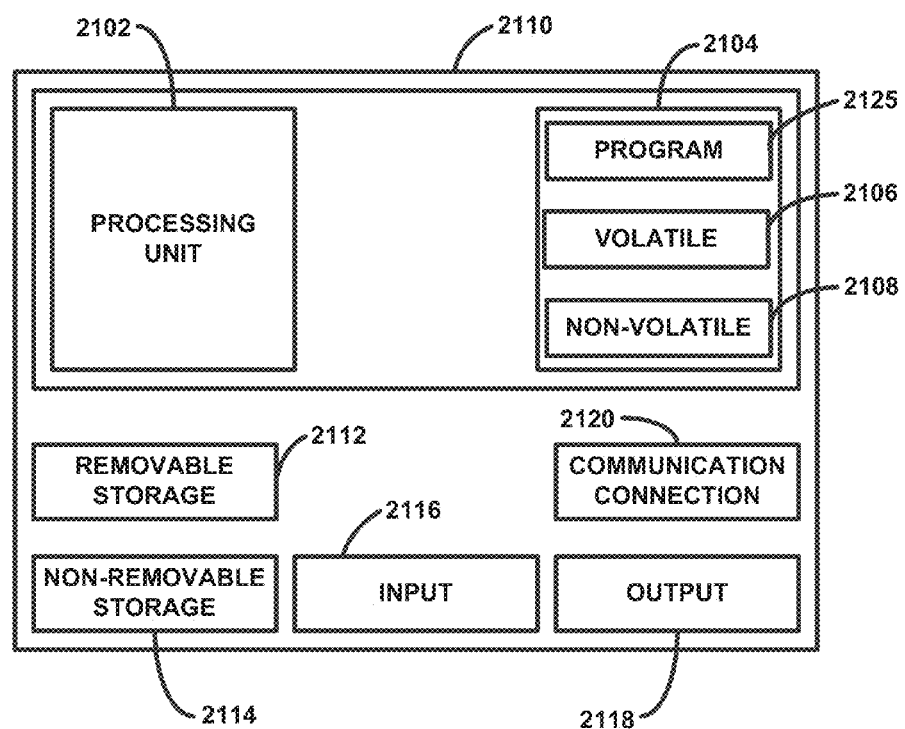
FIG. 21 shows a block diagram of an example of a computer system for implementing techniques.

FIG. 21 is a block diagram of a computing device, according to an example embodiment. In one embodiment, multiple such computer systems are utilized in a distributed network to implement multiple components in a transaction-based environment. An object-oriented, service-oriented, or other architecture can be used to implement such functions and communicate between the multiple systems and components. One example computing device in the form of a computer 2110, can include a processing unit 2102, memory 2104, removable storage 2112, and non-removable storage 2114. Memory 2104 can include volatile memory 2106 and non-volatile memory 2108. Computer 2110 can include—or have access to a computing environment that includes—a variety of computer-readable media, such as volatile memory 2106 and non-volatile memory 2108, removable storage 2112 and non-removable storage 2114. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 2110 can include or have access to a computing environment that includes input 2116, output 2118, and a communication connection 2120. The computer can operate in a networked environment using a communication connection to connect to one or more remote computers, such as database servers. The remote computer can include a personal computer (PC), server, router, network PC, a peer device or other common network node, or the like. The communication connection can include a Local Area Network (LAN), a Wide Area Network (WAN) or other networks.

Another embodiment can be in the form of a system that can be implemented on one or more computers, such as computer 2110. Such a system includes at least one processor, at least one memory device, and at least one network interface device. The system further includes a first network and system management system stored on the at least one memory device and executable by the at least one processor to receive metric messages broadcast on a first network by network entities. The system further includes a metric message connector module stored on the at least one memory device and executable by the at least one processor.

The metric message connector module can be executable by the at least one processor, in some embodiments, to perform different data processing tasks. Such data processing tasks can include processing metric messages received by the first network and system management system to identify, based on configuration data and data of the received metric messages, metric messages to be forwarded to a second network and system management system on a second network. Further, for each received metric message identified to be forwarded to the second network and system management system, the metric message connector module can perform additional data processing tasks.

The addition data processing tasks of the metric message connector module, with regard to each metric message identified to be forwarded to the second network and system management system can include retrieving, from the at least one memory device, an XML template to populate with data of the identified metric message and mapping data that maps metric message data to fields of the XML template. The metric message connector module can then populate the XML template with data of the identified metric message according to the mapping data. Once the XML template can be populated, the metric message connector module can then transmit, via the at least one network interface device encoded within a SOAP message, the populated XML template to the second network and system management system on the second network.

Computer-readable instructions stored on a computer-readable medium are executable by the processing unit 2102 of the computer 2110. A hard drive, CD-ROM, and RAM are some examples of articles including a non-transitory computer-readable medium. For example, a computer program 2125 capable of performing one or more of the methods illustrated and described herein can be stored on a non-transitory computer-readable medium. An example of such a computer program can include a computer readable storage device including instructions stored thereon, the instructions, which when executed by a machine, cause the machine to perform operations including providing filter coefficients from a filter coefficient lookup table at a rate that is a function of a ratio of a first frequency and a second frequency, wherein the first frequency is a frequency of an input signal and the second frequency is a frequency of an output signal, multiplying a filter coefficient of the filter coefficients from the number controlled oscillator and a sample of the input signal, summing results from the multiplier; and providing a result of the summation when the accumulator receives an indicator to dump the result.

A number of techniques exist for conversion of sample rates. Some of them may rely on decimation and interpolation filtering schemes used in ration filter techniques. Some such techniques may have resolution issues. The resolution issues may come at a decreased cost in terms of hardware real estate.

Another option which can put more constraints on a data converter card, can be including a tuning of the DAC and ADC clocks. Such methods can allow for cheaper filters to act as a coarse conversion.

A possible advantage of one or more embodiments discussed herein can include avoiding hardware real estate complexity and clock variability. One or more embodiments discussed herein can allow the A/D and D/A clocks to remain fixed. The A/D and D/A clocks 322 and 508 can perform within about a 0.14 Hz resolution, such as by using a 32 bit NCO 202. One or more embodiments can utilize 11 bit filter coefficients, transmit SRC 104 input precision and receive SRC 106 output precision equal to a desired precision. The transmit SRC 104 output precision and the receive SRC 106 input precision can be a function of the A/D and D/A clocks, respectively. These precisions can all be sufficient to meet the data rate and spectral mask requirements of the MIL-STD-188-165A and IESS-308 standards.

An annotated implementation of a transmit SRC 104 system is provided in Matlab code in Appendix A. An annotated implementation of a receive An annotated implementation of a receive SRC 106 system is provided in Matlab code in Appendix B.

This section describes the transformation of floating point numbers to fixed point numbers. Such knowledge can be helpful in determining how many bits the filter coefficients should be. In this analysis it is assumed that input bit width to the receive SRC 106 is defined by the ADC and the output width of the receive SRC is specified by the variable rate waveform. A complimentary situation can be realized on the transmit SRC 104 side.

An annotated implementation of MATLAB code configured to adapt 128 bit floating point to 11 bit fixed point is provided in Appendix C.

A result of mapping a floating point representation into large integer value fixed point levels is that the spectrum can grow beyond the bounds of a given specification or spectral mask. The MATLAB code provided about can proportion the spectrum gains back to about 0 dB.

Examples of table of filter coefficient lookup tables can be found in Appendix D.

Additional Notes and Examples

In Example 1 an apparatus can include a sample rate converter that can include an input configured to receive an input signal with a first frequency and an output configured to provide an output signal with a second frequency different from the first frequency.

In Example 2, the apparatus of Example 1 can include a filter coefficient lookup table and a numerically controlled oscillator configured to provide filter coefficients from the filter coefficient lookup table at a rate that is a function of the first frequency and the second frequency.

In Example 3, the apparatus of at least one of Examples 1-2 can include a multiplier configured to produce an output that is the product of a filter coefficient of the filter coefficients from the numerically controlled oscillator and a sample of an input signal and an accumulator configured to sum an output of the multiplier and provide a result of the summation when the accumulator receives an indicator to dump the result.

In Example 4, the sample rate converter of at least one of Examples 1-3 is a transmit sample rate converter, the input is a transmit input, the input signal is a first input signal, the output is a transmit output, the output signal is a first output signal, the filter coefficient lookup table is a transmit filter coefficient lookup table, the numerically controlled oscillator is a transmit numerically controlled oscillator, the rate is a function of the second frequency divided by the first frequency, the multiplier is a transmit multiplier, the output signal frequency is a transmit output signal frequency, the input signal frequency is a transmit input signal frequency, and the accumulator is a transmit accumulator.

In Example 5, the apparatus of at least one of Examples 1-4 includes a receive sample rate converter including a receive input configured to receive a second input signal, the second output signal with the second frequency and a receive output configured to provide a second output signal, the second output signal with the first frequency.

In Example 6, the apparatus of at least one of Examples 1-5 includes a receive filter coefficient lookup table and a receive numerically controlled oscillator configured to provide filter coefficients from the receive filter coefficient lookup table at the rate proportional to the first frequency divided by the second frequency.

In Example 7, the apparatus of at least one of Examples 1-6 includes a receive multiplier configured to produce an output that is the product of a filter coefficient of the filter coefficients from the numerically controlled oscillator and a sample of the output signal to the receive sample rate converter and a receive accumulator configured to sum an output of the receive multiplier and provide a result of the summation when the receive accumulator receives an indicator to dump the result.

In Example 8, the apparatus of at least one of Examples 1-7 includes a digital to analog converter coupled to the transmit sample rate converter and configured to produce an analog signal from results received from the transmit accumulator and a band pass filter configured to provide a filtered version of the analog signal.

In Example 9, the apparatus of at least one of Examples 1-8 includes an analog to digital converter configured to provide samples of the filtered version of the analog signal to the receive sample rate converter.

In Example 10, the analog to digital converter and the digital to analog converter of at least one of Examples 1-9 are clocked at the same frequency.

In Example 11, the receive filter coefficient lookup table of at least one of Examples 1-10 includes coefficients corresponding to a Sinc-Blackman filter.

In Example 12, the apparatus of at least one of Examples 1-11 is a high data rate radio frequency ground modem.

In Example 13 a method includes receiving, at an input, an input signal with a first frequency and providing, using a numerically controlled oscillator, filter coefficients from a filter coefficient lookup table at a rate that is a function of a ratio of the first frequency and a second frequency, wherein the second frequency is a frequency of an output signal.

In Example 14, the method of at least one of Examples 1-13 includes multiplying, using a multiplier, a filter coefficient of the filter coefficients from the numerically controlled oscillator and a sample of the input signal, summing, using an adder, results from the multiplier, and providing a result of the summation when the accumulator receives an indicator from the umber controlled oscillator to dump the result.

In Example 15, the method of at least one of Examples 1-14 includes converting, using a digital to analog converter, the dumped results to an analog signal.

In Example 16, the method of at least one of Examples 1-15 includes filtering, using a band pass filter, the analog signal.

In Example 17, the method of at least one of Examples 1-16 includes transmitting the analog signal to a sample rate converter.

In Example 18, the method of at least one of Examples 1-17 includes sampling, using an analog to digital converter, the filtered analog signal received at the sample rate converter.

In Example 19, the method of at least one of Examples 1-18 includes clocking the digital to analog converter and the analog to digital converter at the same frequency.

In Example 20, receiving, at the input of at least one of Examples 1-19 includes receiving, at an input to a high data rate radio frequency ground modem.

In Example 21 a computer readable storage device including instructions stored thereon, the instructions, which when executed by a machine, cause the machine to perform operations including providing filter coefficients from a filter coefficient lookup table at a rate that is a function of a ratio of a first frequency and a second frequency, wherein the first frequency is a frequency of an input signal and the second frequency is a frequency of an output signal.

In Example 22, the computer readable storage device of at least one of Examples 1-21 includes instructions, which when executed by the machine cause the machine to perform operations including multiplying a filter coefficient of the filter coefficients from the numerically controlled oscillator and a sample of the input signal, summing results from the multiplier, and providing a result of the summation when the accumulator receives an indicator to dump the result.

In Example 23, the computer readable storage device of at least one of Examples 1-22 includes instructions, wherein the instructions further include instructions, which when executed by the machine, cause the machine to perform operations including converting the dumped result to an analog signal.

In Example 24, the computer readable storage device of at least one of Examples 1-23 includes instructions, wherein the instructions further include instructions, which when executed by the machine, cause the machine to perform operations including band pass filtering the analog signal.

In Example 25, the computer readable storage device of at least one of Examples 1-24 includes instructions, wherein the instructions further include instructions, which when executed by the machine, cause the machine to perform operations including transmitting the analog signal to a sample rate converter.

In Example 26, the computer readable storage device of at least one of Examples 1-25 includes instructions, wherein the instructions further include instructions, which when executed by the machine, cause the machine to perform operations including sampling the filtered analog signal received at the sample rate converter.

In Example 27, the computer readable storage device of at least one of Examples 1-26 includes instruction, wherein the instructions further include instructions, which when executed by the machine, cause the machine to perform operations including clocking a digital to analog converter and an analog to digital converter at the same frequency.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the disclosed subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The functions or algorithms described herein are implemented in hardware, software, or a combination of software and hardware in some embodiments. The software can comprise computer executable instructions stored on computer readable media such as memory or other type of storage devices. Further, described functions can correspond to modules, which can be software, hardware, firmware, or any combination thereof. Multiple functions are performed in one or more modules as desired, and the embodiments described are merely embodiments. The software is executed on a digital signal processor, ASIC, microprocessor, or other type of processor operating on a system, such as a personal computer, server, a router, or other device capable of processing data including network interconnection devices.

Some embodiments implement the functions in two or more specific interconnected hardware modules or devices with related control and data signals communicated between and through the modules, or as portions of an application-specific integrated circuit. Thus, process flows can be applicable to software, firmware, and hardware implementations.

Systems and methods of the present disclosure can be implemented on a mobile device as a mobile application, web-based application, on a desktop computer as a computer application, or a combination thereof. A mobile application can operate on a Smartphone, tablet computer, portable digital assistant (PDA), ruggedized mobile computer, or other mobile device. The mobile device can be connected to the Internet or network via Wi-Fi, Wide Area Network (WAN), cellular connection, WiMax, Serial Front Panel Data Port (Serial FPDP), Rapid I/O Transport, or any other type of wired or wireless method of networking connection. In some embodiments, a web-based application can be delivered as a software-as-a-service (SaaS) package (e.g., cloud-based embodiments) accessible via a device app, a web browser application, or other suitable application, depending on the particular embodiment.

It will be readily understood to those skilled in the art that various other changes in the details, material, and arrangements of the parts and method stages which have been described and illustrated in order to explain the nature of the inventive subject matter may be made without departing from the principles and scope of the inventive subject matter as expressed in the subjoined claims.

What is claimed is:

1. An apparatus comprising:
a transmit sample rate converter comprising:
a first port configured to receive a first signal, the first signal having a first frequency;
a second port configured to provide an second signal, the second signal having a second frequency different from the first frequency;
a transmit filter coefficient lookup table;
a transmit numerically controlled oscillator configured to provide transmit filter coefficients from the transmit filter coefficient lookup table at a rate that is a function of the first frequency divided by the second frequency;
a transmit multiplier configured to multiply a transmit filter coefficient of the transmit filter coefficients from the transmit numerically controlled oscillator and a sample of the first signal; and
a transmit accumulator configured to sum products from the transmit multiplier and provide a result of the summation when the transmit accumulator receives an indicator to dump the result; and
a receive sample rate converter comprising:
a third port configured to receive a third signal, the third signal having the second frequency;
a fourth port configured to provide a fourth signal, the fourth signal having the first frequency;
a receive filter coefficient lookup table;
a receive numerically controlled oscillator configured to provide receive filter coefficients from the receive filter coefficient lookup table at the rate proportional to the first frequency divided by the second frequency;
a receive multiplier configured to multiply a receive filter coefficient of the receive filter coefficients from the receive numerically controlled oscillator and a sample of the third signal; and
a receive accumulator configured to sum products of the receive multiplier and provide a result of the summation when the receive accumulator receives an indicator to dump the result.

2. The apparatus of claim 1, further comprising:
a digital to analog converter coupled to the transmit sample rate converter and configured to produce an analog signal from results received from the transmit accumulator; and
a band pass filter configured to provide a filtered version of the analog signal.

3. The apparatus of claim 2, further comprising an analog to digital converter configured to provide samples of the filtered version of the analog signal to the receive sample rate converter.

4. The apparatus of claim 3, wherein the analog to digital converter and the digital to analog converter are clocked at the same frequency.

5. The apparatus of claim 4, wherein the receive filter coefficient lookup table includes coefficients corresponding to a Sinc-Blackman filter.

6. The apparatus of claim 5, wherein the apparatus is a high data rate radio frequency ground modem.

7. A method comprising:
receiving, at a first port, a signal, the signal having a first frequency;
providing, using a numerically controlled oscillator, filter coefficients from a filter coefficient lookup table at a rate that is a function of a ratio of the first frequency and a second frequency, wherein the second frequency is a frequency of a second signal the second frequency is different from the first frequency;
multiplying, using a multiplier, a filter coefficient of the filter coefficients from the numerically controlled oscillator and a sample of the input signal;
summing, using an accumulator, products from the multiplier;
providing a result of the summation when the accumulator receives an indicator from the numerically controlled oscillator to dump the result;

converting, using a digital to analog converter, the dumped results to an analog signal; and filtering, using a band pass filter, the analog signal.

8. The method of claim 7, further comprising:

transmitting the analog signal to a sample rate converter.

9. The method of claim 8, further comprising:

sampling, using an analog to digital converter, the filtered analog signal received at the sample rate converter.

10. The method of claim 9, further comprising:

clocking the digital to analog converter and the analog to digital converter at the same frequency.

11. The method of claim 10, wherein the input is an input to a high data rate radio frequency ground modem.

12. A computer readable storage device including instructions stored thereon, the instructions, which when executed by a machine, cause the machine to perform operations comprising:

providing filter coefficients from a filter coefficient lookup table at a rate that is a function of a ratio of a first frequency and a second frequency, wherein the first frequency is a frequency of a first signal and the second frequency is a frequency of a second signal;

multiplying a filter coefficient of the filter coefficients and a sample of the first signal;

summing results of the multiplication;

providing a result of the summation when an indicator to dump the result is received;

converting the dumped result to an analog signal; and band pass filtering the analog signal.

13. The computer readable storage device of claim 12, wherein the instructions further comprise instructions, which when executed by the machine, cause the machine to perform operations comprising:

transmitting the analog signal to a sample rate converter.

14. The computer readable storage device of claim 13, wherein the instructions further comprise instructions, which when executed by the machine, cause the machine to perform operations comprising:

sampling the filtered analog signal received at the sample rate converter.

15. The computer readable storage device of claim 14, wherein the instructions further comprise instructions, which when executed by the machine, cause the machine to perform operations comprising:

clocking a digital to analog converter and an analog to digital converter at the same frequency.

\* \* \* \* \*

UNITED STATES PATENT AND TRADEMARK OFFICE
CERTIFICATE OF CORRECTION

PATENT NO. : 8,786,472 B1
APPLICATION NO. : 13/770862
DATED : July 22, 2014
INVENTOR(S) : Gregory B. Prince Page 1 of 1

It is certified that error appears in the above-identified patent and that said Letters Patent is hereby corrected as shown below:

In the Specification,

In column 5, line 48, after "(D/A)" insert --converter--, therefor

In column 6, line 10, delete "A/D 506 converter" and insert --A/D converter 506--, therefor In column 6, line 43, delete "524" and insert --520--, therefor In column 8, line 16, delete "$\{(h_j(\varphi)\}$" and insert --$\{h_j(\varphi)\}$--, therefor In column 8, line 62, delete "102" and insert --102A or 102B--, therefor In column 9, line 41, delete "???" and insert --508--, therefor In column 9, line 48, delete "522" and insert --508--, therefor Signed and Sealed this
Eighteenth Day of November, 2014

Michelle K. Lee
*Deputy Director of the United States Patent and Trademark Office*